United States Patent
Ishihara et al.

(10) Patent No.: US 9,949,372 B2
(45) Date of Patent: Apr. 17, 2018

(54) PRINTED WIRING BOARD AND METHOD FOR MANUFACTURING THE SAME

(71) Applicant: IBIDEN CO., LTD., Ogaki (JP)

(72) Inventors: Teruyuki Ishihara, Ogaki (JP); Hiroyuki Ban, Ogaki (JP); Haiying Mei, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/441,540

(22) Filed: Feb. 24, 2017

(65) Prior Publication Data

US 2017/0245365 A1 Aug. 24, 2017

(30) Foreign Application Priority Data

Feb. 24, 2016 (JP) .................. 2016-033510

(51) Int. Cl.
| | |
|---|---|
| *H05K 1/11* | (2006.01) |
| *H05K 3/00* | (2006.01) |
| *H05K 3/02* | (2006.01) |
| *H05K 3/20* | (2006.01) |
| *H05K 3/28* | (2006.01) |

(Continued)

(52) U.S. Cl.
CPC ........ *H05K 1/115* (2013.01); *H01L 23/49534* (2013.01); *H05K 1/112* (2013.01); *H05K 1/113* (2013.01); *H05K 3/0061* (2013.01); *H05K 3/025* (2013.01); *H05K 3/205* (2013.01); *H05K 3/284* (2013.01); *H05K 3/303* (2013.01); *H05K 3/388* (2013.01); *H05K 3/4007* (2013.01); *H05K 3/4038* (2013.01); *H05K 3/243* (2013.01); *H05K 3/4682* (2013.01); *H05K 2201/0367* (2013.01);

(Continued)

(58) Field of Classification Search
CPC ... H05K 1/03; H05K 1/09; H05K 1/11; H05K 1/18; H05K 3/10; H05K 3/30; H05K 3/40; H05K 3/46; H01L 21/48; H01L 21/60; H01L 23/455; H01L 23/495; H01L 23/498
USPC .............. 174/262, 250, 251, 256, 257, 261; 257/675; 29/17.3, 837; 1/1
See application file for complete search history.

(56) References Cited

U.S. PATENT DOCUMENTS 4,663,497 A * 5/1987 Reimann ................ H05K 3/062
174/264
5,710,063 A * 1/1998 Forehand ............. H05K 1/0269
257/797

(Continued)

*Primary Examiner* — Xiaoliang Chen
(74) *Attorney, Agent, or Firm* — Oblon, McClelland, Maier & Neustadt, L.L.P.

(57) ABSTRACT

A printed wiring board includes a laminate, a wiring layer formed on first main surface of the laminate and including conductor pads, via conductors including first and second via conductors and formed in the laminate such that each via conductor has diameter gradually reducing from the first main surface toward second main surface of the laminate, and conductor post formed on the first via conductors such that each conductor post includes a metal foil and a plating layer formed on the metal foil. The via conductors are formed such that the first via conductors are positioned in an outer edge portion of the laminate and have minimum-diameter-side surfaces positioned to form a same plane with the second main surface of the laminate and that the second via conductors are positioned in a central portion of the laminate and have minimum-diameter-side surfaces recessed from the second main surface of the laminate.

16 Claims, 21 Drawing Sheets

(51) Int. Cl.
*H05K 3/30* (2006.01)
*H05K 3/38* (2006.01)
*H05K 3/40* (2006.01)
*H01L 23/495* (2006.01)
*H05K 3/24* (2006.01)
*H05K 3/46* (2006.01)

(52) U.S. Cl.
CPC .............. *H05K 2201/09527* (2013.01); *H05K 2201/10674* (2013.01)

(56) References Cited

U.S. PATENT DOCUMENTS

| | | | | |
|---|---|---|---|---|
| 6,041,495 | A * | 3/2000 | Yoon | H01L 23/3107 257/E23.063 |
| 6,555,908 | B1 * | 4/2003 | Eichelberger | H01L 21/56 257/723 |
| 6,798,050 | B1 * | 9/2004 | Homma | H01L 24/03 257/678 |
| 9,661,761 | B2 * | 5/2017 | Lin | H05K 3/4682 |
| 9,699,905 | B2 * | 7/2017 | Nishida | H05K 3/28 |
| 9,713,267 | B2 * | 7/2017 | Furuta | H05K 3/4007 |
| 2001/0042637 | A1 * | 11/2001 | Hirose | H05K 3/0035 174/255 |
| 2002/0050407 | A1 * | 5/2002 | Sohn | H01L 23/3128 174/262 |
| 2002/0129894 | A1 * | 9/2002 | Liu | B32B 7/12 156/291 |
| 2006/0102384 | A1 * | 5/2006 | Watanabe | H01L 23/49816 174/256 |
| 2006/0204650 | A1 * | 9/2006 | Hu | C23C 26/00 427/96.1 |
| 2008/0257596 | A1 * | 10/2008 | Kaneko | H01L 21/4857 174/264 |
| 2008/0308308 | A1 * | 12/2008 | Kobayashi | H01L 21/4853 174/257 |
| 2009/0188806 | A1 * | 7/2009 | Yamasaki | H05K 3/108 205/122 |
| 2009/0194885 | A1 * | 8/2009 | Jobetto | H01L 23/49816 257/773 |
| 2010/0246152 | A1 * | 9/2010 | Lin | H01L 21/563 361/783 |
| 2010/0289134 | A1 | 11/2010 | Chow et al. | |
| 2011/0175213 | A1 * | 7/2011 | Mori | H01L 23/13 257/675 |
| 2011/0227214 | A1 * | 9/2011 | Tateiwa | H01L 21/6835 257/734 |
| 2012/0008295 | A1 * | 1/2012 | Ouchi | H01L 23/3192 361/783 |
| 2012/0186864 | A1 * | 7/2012 | Inoue | B23K 1/00 174/258 |
| 2012/0234589 | A1 * | 9/2012 | Furuichi | H05K 3/4682 174/261 |
| 2012/0247823 | A1 * | 10/2012 | Kasai | H05K 3/3452 174/261 |
| 2012/0298993 | A1 * | 11/2012 | Nagata | H01L 23/481 257/48 |
| 2013/0062108 | A1 * | 3/2013 | Kondo | H05K 3/387 174/258 |
| 2013/0140692 | A1 * | 6/2013 | Kaneko | H05K 1/111 257/737 |
| 2013/0180772 | A1 * | 7/2013 | Inoue | H05K 1/111 174/263 |
| 2014/0196939 | A1 * | 7/2014 | Nishida | H05K 3/28 174/261 |
| 2015/0014020 | A1 * | 1/2015 | Kaneko | H05K 3/4007 174/250 |
| 2015/0027750 | A1 * | 1/2015 | Nishida | H05K 3/3452 174/250 |
| 2015/0077963 | A1 * | 3/2015 | Adachi | H05K 1/144 361/803 |
| 2015/0092356 | A1 * | 4/2015 | Yoshikawa | H01L 25/00 361/746 |
| 2015/0103856 | A1 * | 4/2015 | Hagino | H01S 5/02212 372/44.01 |
| 2015/0250054 | A1 * | 9/2015 | Yoshikawa | H05K 3/4007 361/767 |
| 2015/0282323 | A1 * | 10/2015 | Shimizu | H01L 25/105 361/767 |
| 2015/0357277 | A1 * | 12/2015 | Nagai | H01L 23/49838 174/255 |
| 2016/0014898 | A1 * | 1/2016 | Adachi | H01L 25/105 361/767 |
| 2016/0064319 | A1 * | 3/2016 | Suzuki | H01L 23/49827 174/251 |
| 2016/0219710 | A1 * | 7/2016 | Park | H05K 1/187 |

* cited by examiner

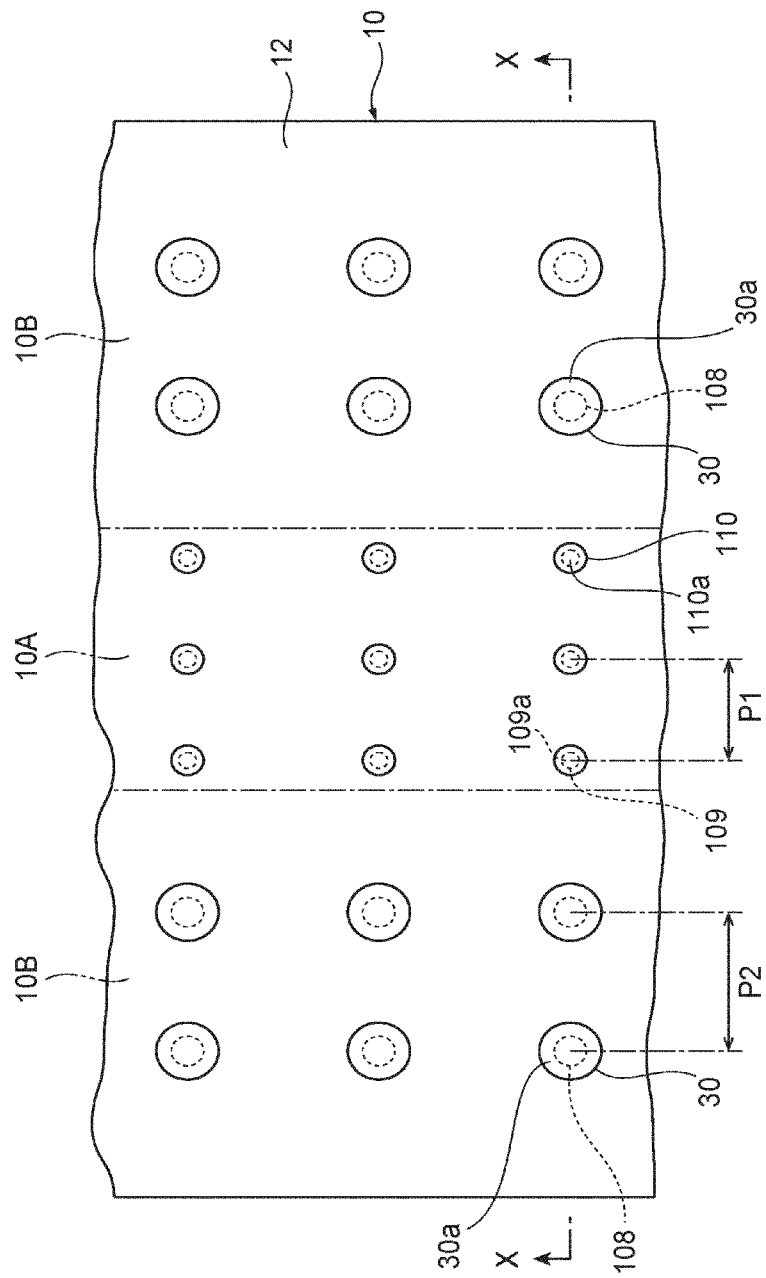

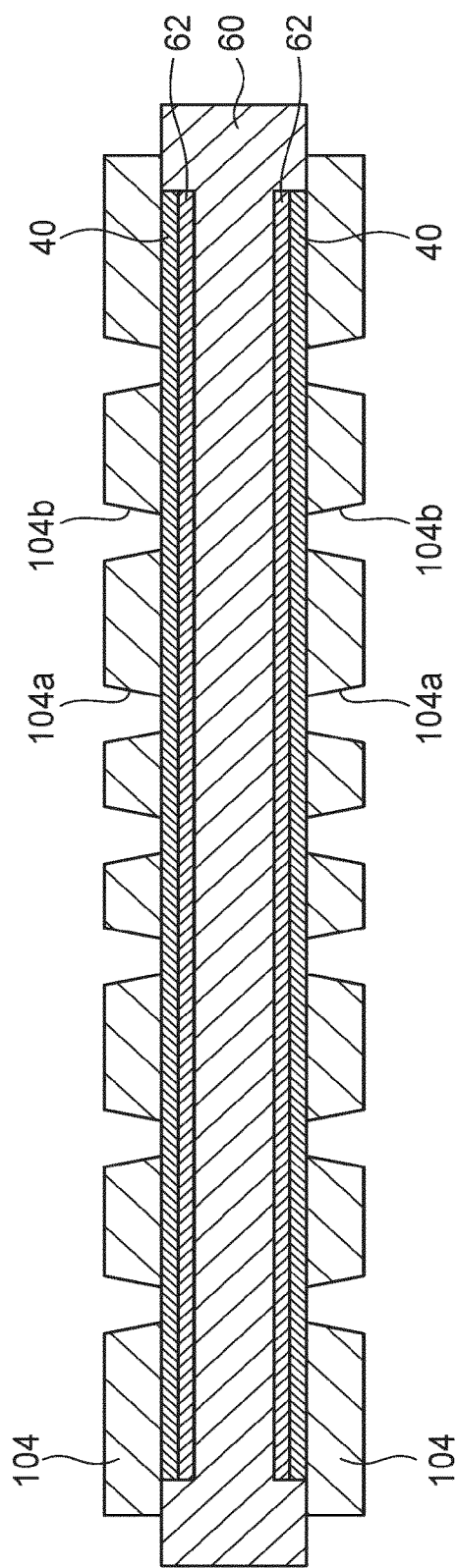

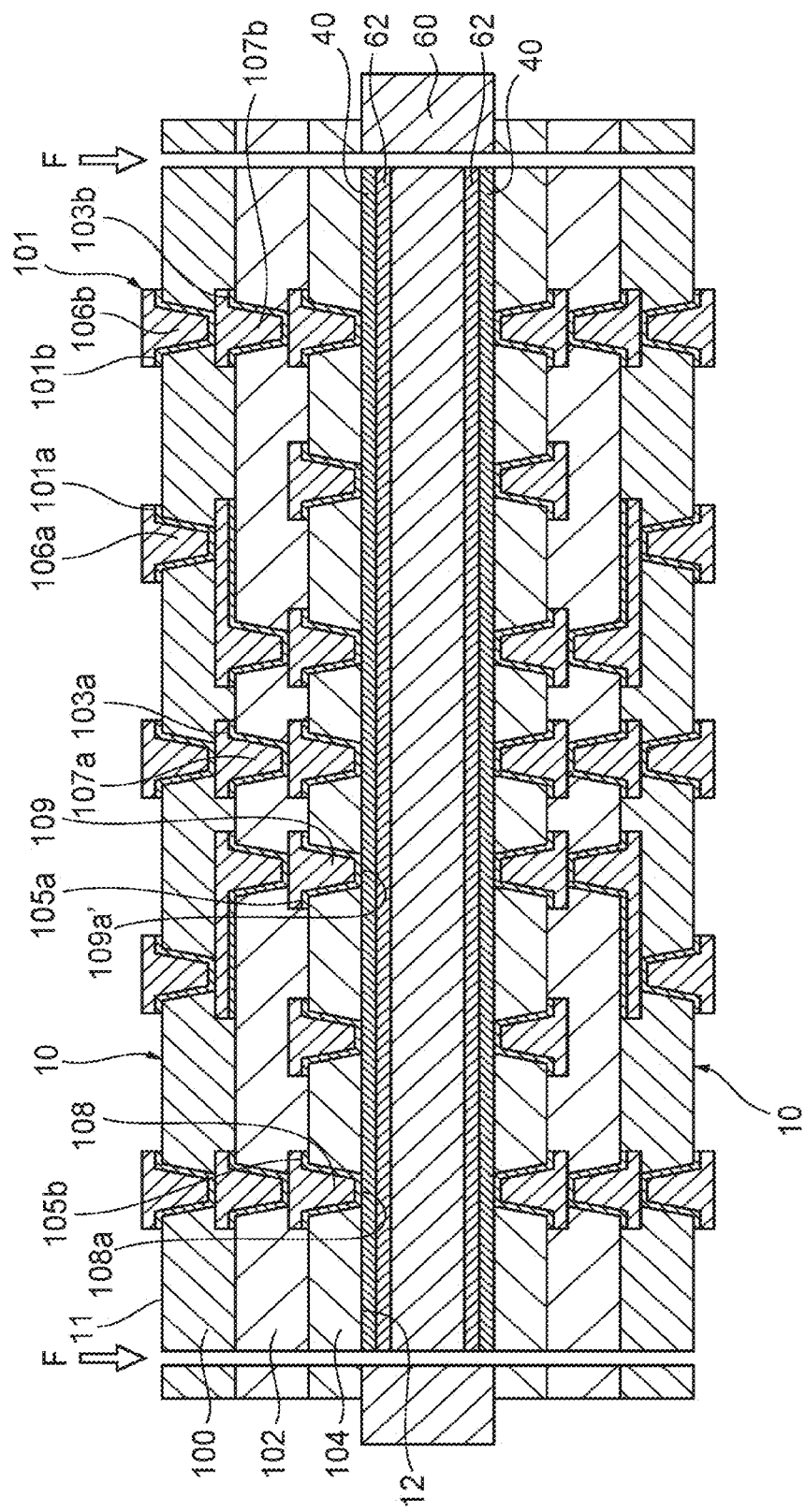

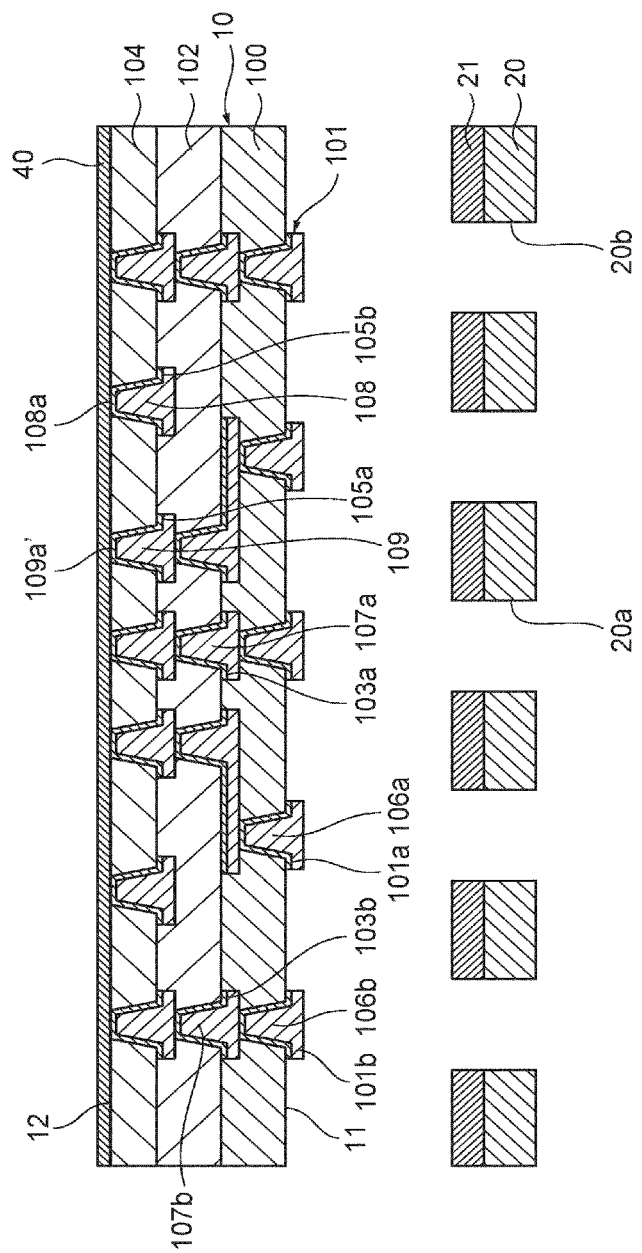

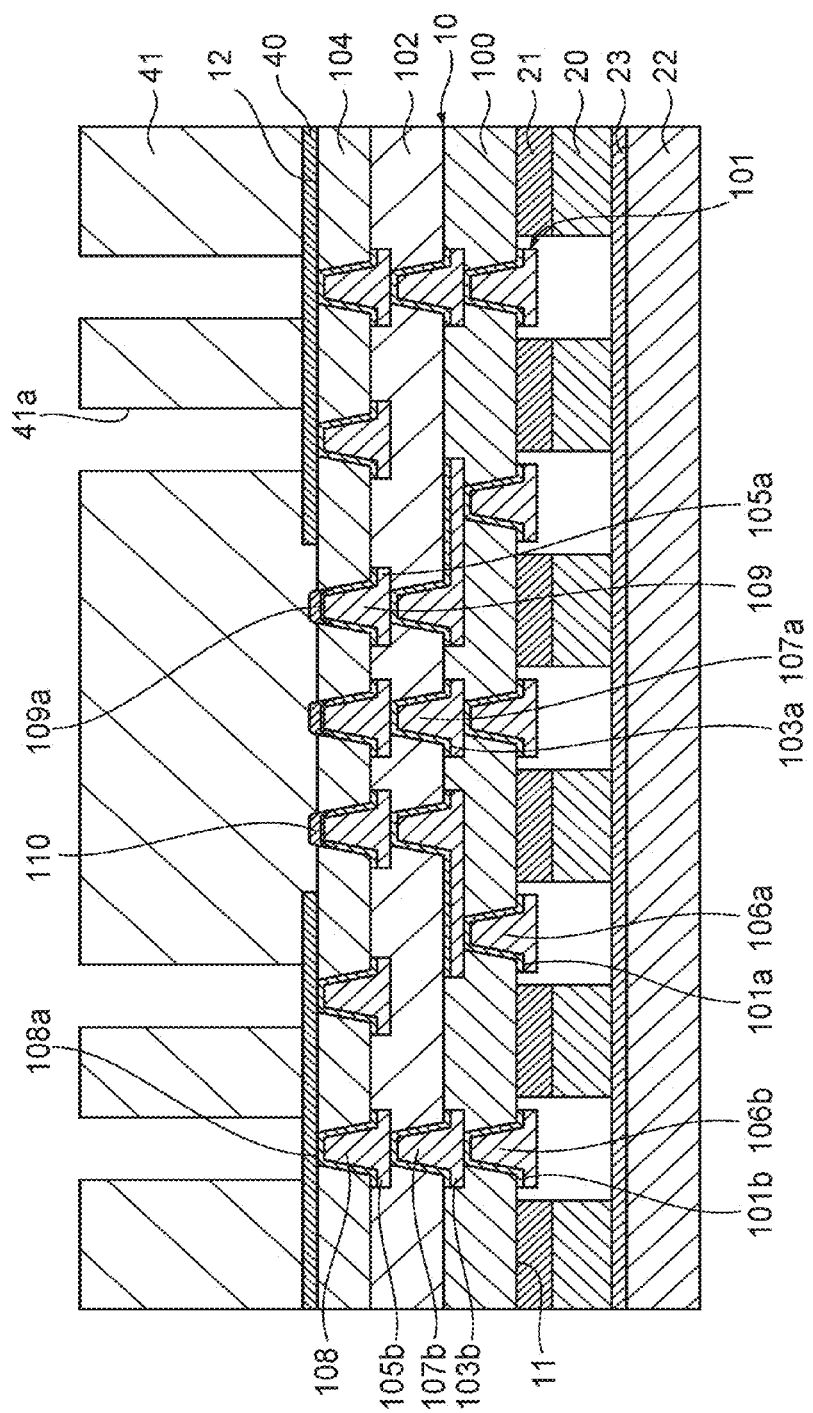

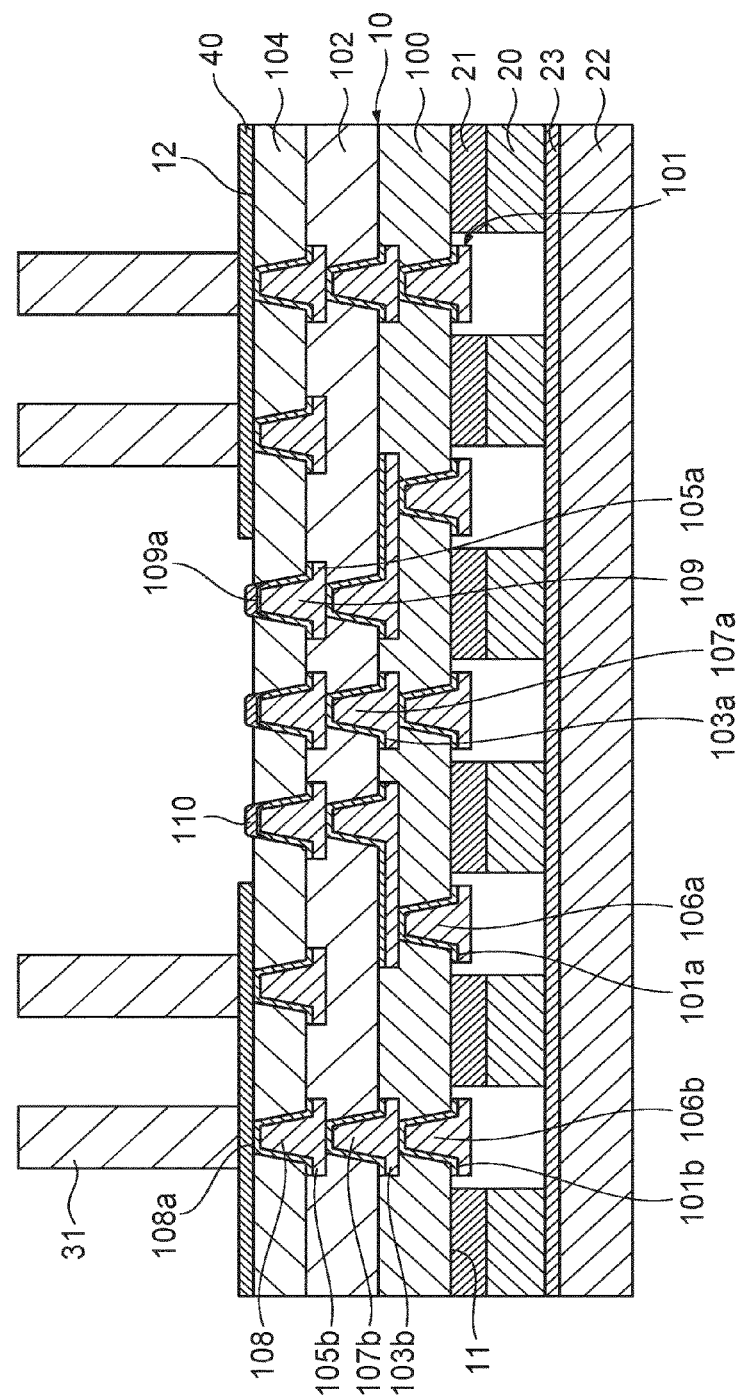

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2016-033510, filed Feb. 24, 2016, the entire contents of which are incorporated herein by reference.

BACKGROUND OF THE INVENTION

Field of the Invention

The present invention relates to a printed wiring board for package-on-package (POP) and a method for manufacturing the printed wiring board.

Description of Background Art

U.S. Patent Application Publication No. 2010/0289134 A1 describes a method in which a lower substrate and an upper substrate are electrically connected via solder balls (that is, solder bumps) formed on conductor pads of the lower substrate. The entire contents of this publication are incorporated herein by reference.

SUMMARY OF THE INVENTION

According to one aspect of the present invention, a printed wiring board includes a laminate, a wiring layer formed on a first main surface of the laminate and including conductor pads, via conductors including first via conductors and second via conductors and formed in the laminate such that each of the via conductors has a diameter gradually reducing from the first main surface toward a second main surface of the laminate on the opposite side with respect to the first main surface, and conductor post formed on the first via conductors respectively such that each of the conductor posts includes a metal foil and a plating layer formed on the metal foil. The via conductors are formed such that the first via conductors are positioned in an outer edge portion of the laminate and have minimum-diameter-side surfaces positioned to form a same plane with respect to the second main surface of the laminate and that the second via conductors are positioned in a central portion of the laminate and have minimum-diameter-side surfaces recessed from the second main surface of the laminate.

According to another aspect of the present invention, a method for manufacturing a printed wiring board includes fixing a metal foil having a carrier copper foil to a first base plate, forming a laminate on the first base plate and via conductors formed in the laminate such that the laminate covers the metal foil having the carrier copper foil and the via conductors include first via conductors and second via conductors such that each of the via conductors has a diameter gradually reducing from a first main surface of the laminate toward a second main surface of the laminate on the opposite side with respect to the first main surface, forming a wiring layer including conductor pads on the first main surface of the laminate, removing the first base plate and the carrier copper foil from the laminate and the metal foil such that the metal foil is exposed on the laminate, fixing a second base plate having openings to the first main surface of the laminate via an adhesive layer having the openings such that the openings in the second base plate expose the conductor pads formed on the first main surface, removing a central portion of the metal foil such that minimum-diameter-side surfaces of the second via conductors are exposed, applying plating such that conductor posts are formed on portions of the metal foil at positions in contact with the first via conductors, and removing the metal foil except the portions in contact with the conductor posts. The forming of the via conductors includes forming the first via conductors in an outer edge portion of a metal foil such that minimum-diameter-side surfaces of the first via conductors are positioned on the metal foil and second via conductors in a central portion of the metal foil such that the minimum-diameter-side surfaces of the second via conductors are positioned on the metal foil.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a partial plan view of the printed wiring board;

FIG. 4B is a process diagram describing the method for manufacturing the printed wiring board;

FIG. 4D is a process diagram describing the method for manufacturing the printed wiring board;

FIG. 5A is a process diagram describing the method for manufacturing the printed wiring board;

FIG. 6A is a process diagram describing a method for manufacturing the printed wiring board;

FIG. 6B is a process diagram describing a method for manufacturing the printed wiring board;

DETAILED DESCRIPTION OF THE EMBODIMENTS

Figure 1:
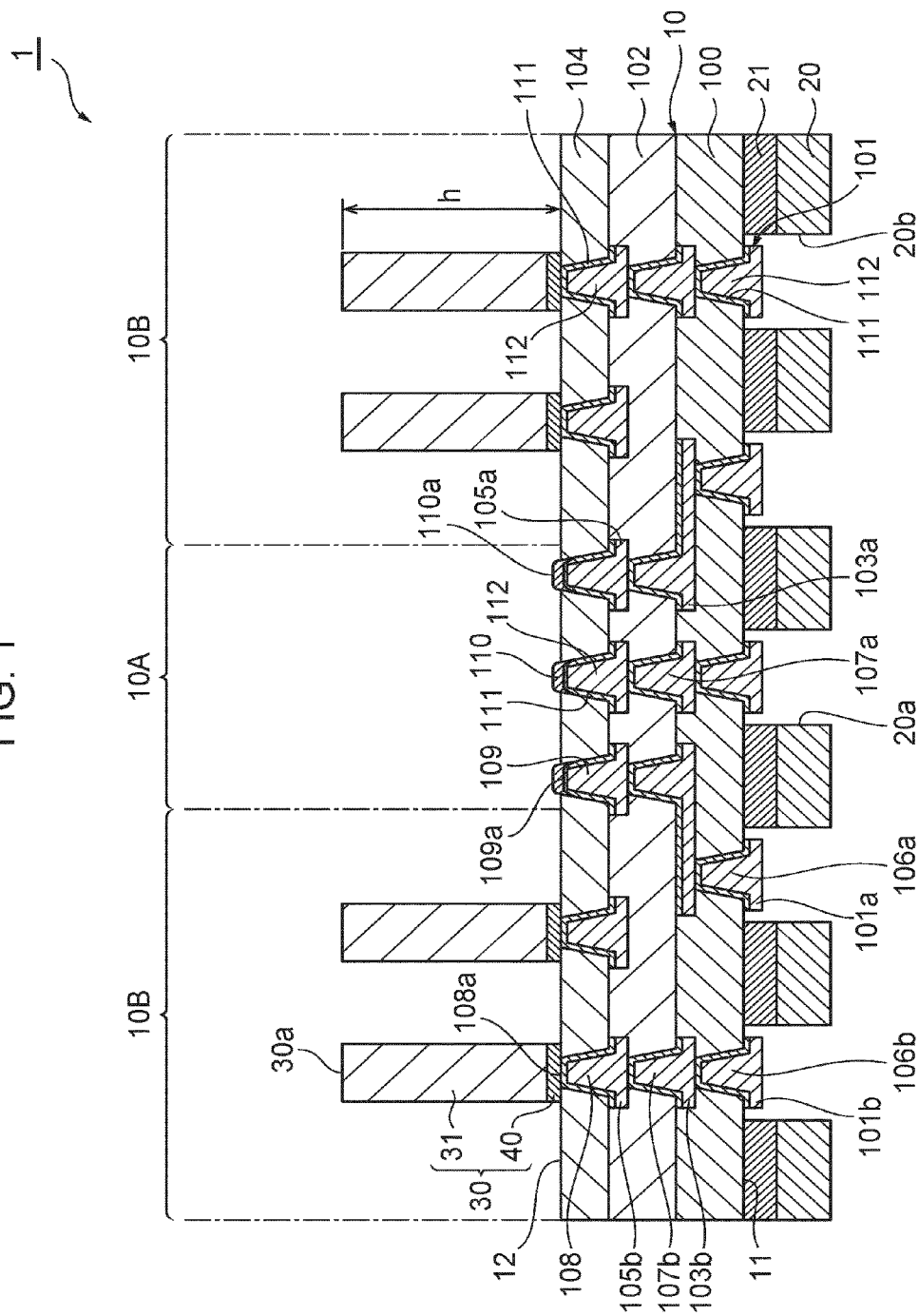
FIG. 1 is a schematic cross-sectional view illustrating a printed wiring board according to a first embodiment.

The embodiments will now be described with reference to the accompanying drawings, wherein like reference numerals designate corresponding or identical elements throughout the various drawings.

First Embodiment

FIG. 1 is a schematic cross-sectional view illustrating a printed wiring board according to a first embodiment. A printed wiring board 1 according to the present embodiment includes a laminate 10 that has a first main surface 11 and a second main surface 12 that is on an opposite side of the first main surface 11, a base plate 20 that is affixed to the first main surface 11 of the laminate 10 via an adhesive layer 21, and multiple conductor posts 30 that are formed on an outer edge portion of the second main surface 12.

The laminate 10 is a build-up structure in which multiple wiring layers and multiple insulating layers are alternately laminated. Specifically, the laminate 10 includes, in an order from the first main surface 11 side toward the second main surface 12 side, an insulating layer 100, an insulating layer 102 and an insulating layer 104. That is, among these insulating layers, the insulating layer 100 is formed on a lowermost side, the insulating layer 104 is formed on an uppermost side, and the insulating layer 102 is formed between the insulating layer 100 and the insulating layer 104. Therefore, a lower surface of the insulating layer 100 forms the first main surface 11 of the laminate 10, and an upper surface of the insulating layer 104 forms the second main surface 12 of the laminate 10. The insulating layers (100, 102, 104), for example, are each formed of an interlayer resin film.

A wiring layer 101 that includes multiple conductor pads (101a) and multiple conductor pads (101b) is formed on the first main surface 11 of the laminate 10. The wiring layer 101 corresponds to a "wiring layer" in the claims and is formed, for example, by an electroless plating layer 111 and an electrolytic plating layer 112. A wiring layer in the present embodiment refers to a conductor layer that forms an electrical circuit, and may include pads and wirings and the like or may include only pads, depending on a formation position of the wiring layer. FIG. 1 illustrates a case where only pads are included.

The conductor pads (101a) are structures for electrically connecting to second via conductors 109 (to be described later), and are positioned in a central portion of the first main surface 11 and are projecting outward (downward in FIG. 1) from the first main surface 11. On the other hand, the conductor pads (101b) are structures for electrically connecting to first via conductors 108 (to be described later), and are positioned in an outer edge portion of the first main surface 11 and are projecting outward from the first main surface 11. In the present embodiment, the conductor pads (101a) and the conductor pads (101b) have the same array pitch and area. However, the present invention is not limited to this. For example, when necessary, it is also possible that the array pitch and area of the conductor pads (101b) positioned in the outer edge portion are larger than the array pitch and area of the conductor pads (101a) positioned in the central portion, or vice versa.

A wiring layer (103a) and a wiring layer (103b) are formed on a lower surface of the insulating layer 102. The wiring layer (103a) is a structure for electrically connecting to the second via conductors 109, and is formed above the conductor pads (101a). The wiring layer (103a) is electrically connected to the conductor pads (101a) via conductors (106a) that are formed inside the insulating layer 100. On the other hand, the wiring layer (103b) is a structure for electrically connecting to the first via conductors 108, and is formed above the conductor pads (101b). The wiring layer (103b) is electrically connected to the conductor pads (101b) via conductors (106b) that are formed inside the insulating layer 100.

Further, a wiring layer (105a) and a wiring layer (105b) are formed on a lower surface of the insulating layer 104. The wiring layer (105a) is a structure for electrically connecting to the second via conductors 109, and is formed above the wiring layer (103a). The wiring layer (105a) is electrically connected to the wiring layer (103a) via conductors (107a) that are formed inside the insulating layer 102. On the other hand, the wiring layer (105b) is a structure for electrically connecting to the first via conductors 108, and is formed above the wiring layer (103b). As illustrated in FIG. 1, among multiple parts of the wiring layer (105b), some are electrically connected to the wiring layer (103b) via via conductors (107b) that are formed inside the insulating layer 102.

Similar to the wiring layer 101, the wiring layers (103a, 103b, 105a, 105b) are each formed by an electroless plating layer 111 and an electrolytic plating layer 112. The via conductors (106a, 106b, 107a, 107b) are each formed in a truncated cone shape that is gradually reduced in diameter from the first main surface 11 toward the second main surface 12. These via conductors (106a, 106b, 107a, 107b) are each formed from an electroless plating layer 111 and an electrolytic plating layer 112.

The multiple first via conductors 108 and the multiple second via conductors 109 are formed inside the insulating layer 104. The first via conductors 108 are formed in an outer edge portion of the insulating layer 104 (that is, in an outer edge portion (10B) of the laminate 10), and are positioned directly below the conductor posts 30. The second via conductors 109 are formed in a central portion of the insulating layer 104 (that is, in a central portion (10A) of the laminate 10). Similar to the via conductors (106a, 106b, 107a, 107b), the first via conductors 108 and the second via conductors 109 are each formed in a truncated cone shape that is gradually reduced in diameter from the first main surface 11 toward the second main surface 12. The first via conductors 108 are each formed from an electroless plating layer 111 and an electrolytic plating layer 112. A minimum-diameter-side surface (108a) of each of the first via conductors 108 is positioned on the same plane as the second main surface 12 of the laminate 10. The first via conductors 108 are electrically connected to the conductor posts 30 that are formed on the first via conductors 108.

Figure 2:
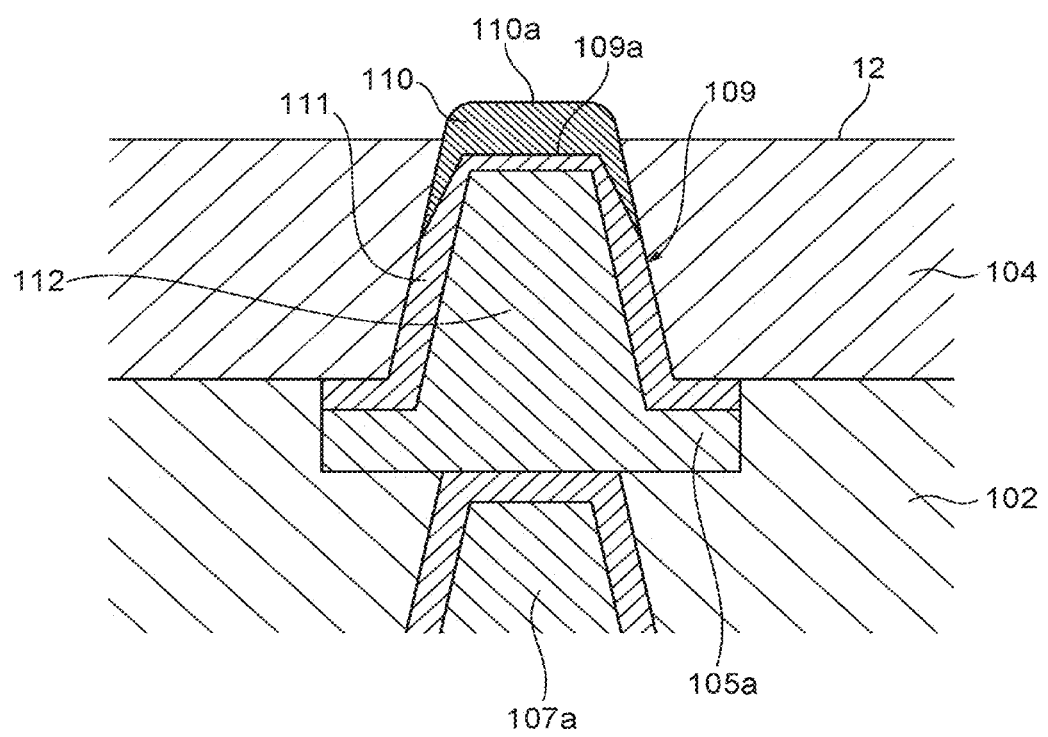
FIG. 2 is a partial enlarged view of a second via conductor.

FIG. 2 is a partial enlarged view of a second via conductor. Similar to the first via conductors 108, the second via conductors 109 are each formed by an electroless plating layer 111 and an electrolytic plating layer 112. As compared to the electroless plating layer 111 of each of the first via conductors 108 and the via conductors (106a, 106b, 107a, 107b), the electroless plating layer 111 of each of the second via conductors 109 is gradually reduced in thickness as it approaches the second main surface 12. A minimum-diameter-side surface (109a) of each of the second via conductors 109 is recessed from the second main surface 12, that is, the surface (109a) is lower than the second main surface 12. A surface treatment layer 110 is formed on the minimum-diameter-side surface (109a). As the surface treatment layer 110, for example, multiple metal films or a single metal film, such as Ni/Pd/Au, Ni/Au, or Sn, may be formed using a plating method.

As illustrated in FIG. 2, the surface treatment layer 110 is formed in a hat-like shape wrapping the electroless plating layer 111 from above and around. Further, a portion of the surface treatment layer 110 enters a gap between the electroless plating layer 111 and the insulating layer 104, and is in close contact with the electroless plating layer 111. An upper surface (110a) of the surface treatment layer 110 protrudes to the outside from the second main surface 12 and is exposed from the second main surface 12. Here, it is also possible that the surface treatment layer 110 is formed such that an upper surface (110a) of the surface treatment layer 110 is positioned on the same plane as the second main surface 12.

The conductor posts 30 are each formed in a columnar shape, and each include a copper foil 40 and a plating layer 31, the copper foil 40 being fondled on the minimum-diameter-side surface (108a) of the first via conductor 108, and the plating layer 31 being formed on the copper foil 40. The plating layer 31 is, for example, a copper plating layer. When a height of each of the conductor posts 30 (that is, a distance from the second main surface 12 to a top surface (30a) of each of the conductor posts 30) is h, it is preferable that 50 μm<h<200 μm. Further, it is preferable that a diameter of each of the conductor posts 30 be larger than a minimum diameter of each of the first via conductors 108 and be in a range of 80-150 μm.

FIG. 3 is a partial plan view of the printed wiring board. A cross-sectional view along an X-X line in FIG. 3 is FIG. 1. As illustrated in FIG. 3, the upper surface (110a) of the surface treatment layer 110 exposed from the second main surface 12 is formed in a circular shape. The minimum-diameter-side surface (109a) of each of the second via conductors 109 covered by the surface treatment layer 110 is also formed in a circular shape. The second via conductors 109 are formed in the central portion (10A) of the laminate 10 at a predetermined pitch (P1). On the other hand, the first via conductors 108 are formed in the outer edge portion (10B) of the laminate 10 at a predetermined pitch (P2), and the minimum-diameter-side surface (108a) of each of first via conductors 108 is formed in a circular shape. The conductor posts 30 that are respectively formed on the first via conductors 108 are arrayed at the same pitch as the first via conductors 108. The pitch (P2) of the first via conductors 108 is larger than the pitch (P1) of the second via conductors 109. Here, the term "pitch" means a distance between centers of adjacent first via conductors 108 or second via conductors 109.

Since the upper surface (110a) of each of the surface treatment layers 110 protrudes to the outside from the second main surface 12, the surface treatment layers 110 and the second via conductors 109 that are respectively covered by the surface treatment layers 110 are used as structures for connecting to an electronic component. The conductor posts 30, together with the first via conductors 108, are used as structures for connecting to another wiring board.

As illustrated in FIG. 1, of the second via conductors 109 and the via conductors (106a, 107a), some are linearly stacked along a lamination direction of the insulating layers (100, 102, 104) and form stacked structures, and others are stacked at shifted positions along the lamination direction and form offset structures. On the other hand, some of the first via conductors 108 and the via conductors (106b, 107b) are linearly stacked along the lamination direction and form stacked structures.

The base plate 20 is formed of a material having certain strength such as a metal plate or a prepreg material, and is affixed to the first main surface 11 of the laminate 10 via the adhesive layer 21. Multiple openings (20a) for exposing the conductor pads (101a) and multiple openings (20b) for exposing the conductor pads (101b) are formed in the base plate 20 and the adhesive layer 21. As illustrated in FIG. 1, at least some of the multiple conductor pads (101b) exposed from the openings (20b) are coaxially aligned with the via conductors (106b, 107b), the first via conductors 108 and the conductor posts 30.

In the printed wiring board 1 that is structured as described above, the conductor posts 30 are formed on the second main surface 12 of the laminate 10. Therefore, the printed wiring board 1 can be electrically connected to another wiring board via the conductor posts 30. The conductor posts 30, unlike conventional solder balls, do not laterally expand during melting. Therefore, intervals between the conductor posts 30 can be reduced while an electrical short circuit between adjacent conductor posts 30 can be prevented. Therefore, formation of wirings at a fine pitch in the printed wiring board 1 can be easily achieved.

In addition, since the conductor posts 30 are each formed from the copper foil 40 and the plating layer 31, the copper foil 40 is interposed between each of the first via conductors 108 and the plating layer 31. Therefore, stress acting on the first via conductors 108 can be relaxed and thus, occurrence of a crack in the first via conductors 108 due to stress concentration can be suppressed and an effect of improving connection reliability can be expected. Further, since the surface treatment layer 110 is formed on the minimum-diameter-side surface (109a) of each of the second via conductors 109, mountability of the second via conductors 109 can be improved. Further, since the upper surface (110a) of the surface treatment layer 110 protrudes to the outside from the second main surface 12, an external electronic component can be easily mounted via the surface treatment layer 110.

Further, since the base plate 20 is affixed to the first main surface 11 of the laminate 10 via the adhesive layer 21, the base plate 20 can increase strength of the printed wiring board 1 and thus can suppress occurrence of warpage due to a difference in thermal expansion coefficient between materials. As a result, continuity check of the printed wiring board 1 can be easily performed and an effect of increasing accuracy of the continuity check can be achieved. Further, since the openings (20a, 20b) for exposing the conductor pads (101a, 101b) are formed in the base plate 20 and the adhesive layer 21, the continuity check can be easily performed through the openings (20a, 20b) while occurrence of warpage of the printed wiring board 1 can be prevented.

When continuity check between a conductor post 30 and a conductor pad (101b) is performed, for example, one terminal of a meter for the continuity check is brought into contact with the top surface (30a) of the conductor post 30 and the other terminal of the meter is brought into contact with the conductor pad (101b) by inserting the other terminal into the opening (20b) that exposes the conductor pad (101b), and a resistance value between the conductor post 30 and the conductor pad (101b) is measured. On the other hand, when continuity check between a surface treatment layer 110 and a conductor pad (101a) is performed, one terminal of the meter for the continuity check is brought into contact with the upper surface (110a) of the surface treatment layer 110 and the other terminal of the meter is brought into contact with the conductor pad (101a) by inserting the other terminal into the opening (20a) that exposes the conductor pad (101a), and a resistance value between the surface treatment layer 110 and the conductor pad (101a) is measured.

Method for Manufacturing Printed Wiring Board

Figure 4A:
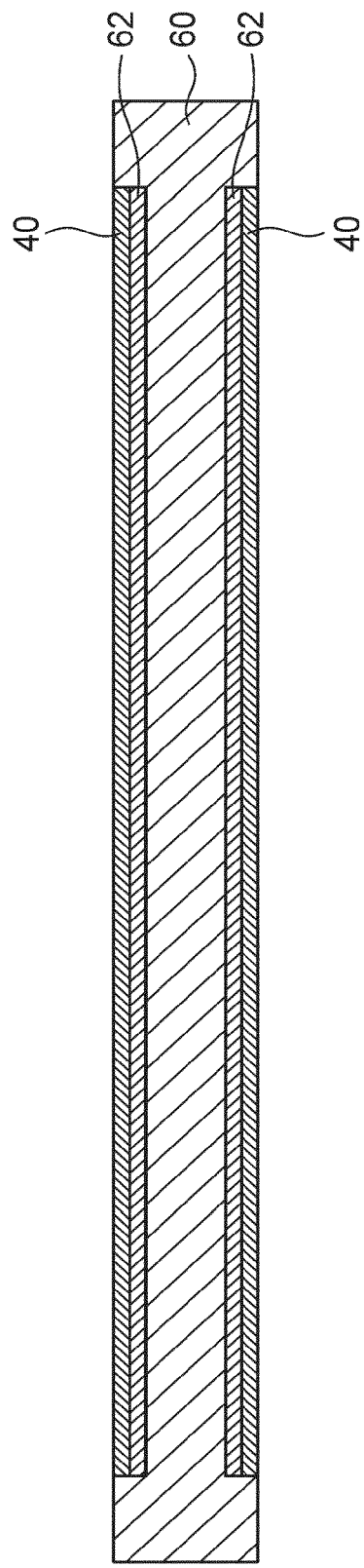
FIG. 4A is a process diagram describing a method for manufacturing the printed wiring board.

In the following, with reference to FIG. 4A-6E, a method for manufacturing the printed wiring board 1, and mounting and resin sealing of an electronic component are described. Processes described below are each performed on both upper and lower sides of a first base plate 60, a second base plate 20 (that is, the above-described base plate 20) and a third base plate 22. In FIGS. 4D and 5B, reference numeral symbols are used only for an upper portion. However, reference numeral symbols for a lower portion are the same as those for the upper portion. In FIG. 5C-6C, for clarity of the drawings, only an upper side of the third base plate 22 is illustrated.

First Process

First, the first base plate 60 is prepared. The first base plate 60, for example, is formed from a glass-containing prepreg material. Next, a copper foil 40 with a carrier copper foil 62 is affixed to both upper and lower sides of the first base plate 60 (see FIG. 4A). Although not illustrated in the drawings, a release layer is applied between the carrier copper foil 62 and the copper foil 40.

Second Process

The laminate 10 is formed on the copper foil 40 using a semi-additive method (semi-additive process: SAP). Specifically, first, the insulating layer 104 is laminated on the copper foil 40 by laminating an interlayer resin film using a vacuum pressure-bonding method while increasing temperature. Subsequently, by laser irradiation, multiple via holes (104a) for exposing the copper foil 40 are Ruined in the central portion of the insulating layer 104 and multiple via holes (104b) for exposing the copper foil 40 are formed in the outer edge portion of the insulating layer 104. The formed via holes (104a, 104b) each have a truncated cone shape of which a diameter gradually increases along a direction away from the first base plate 60 (see FIG. 4B).

Figure 4C:
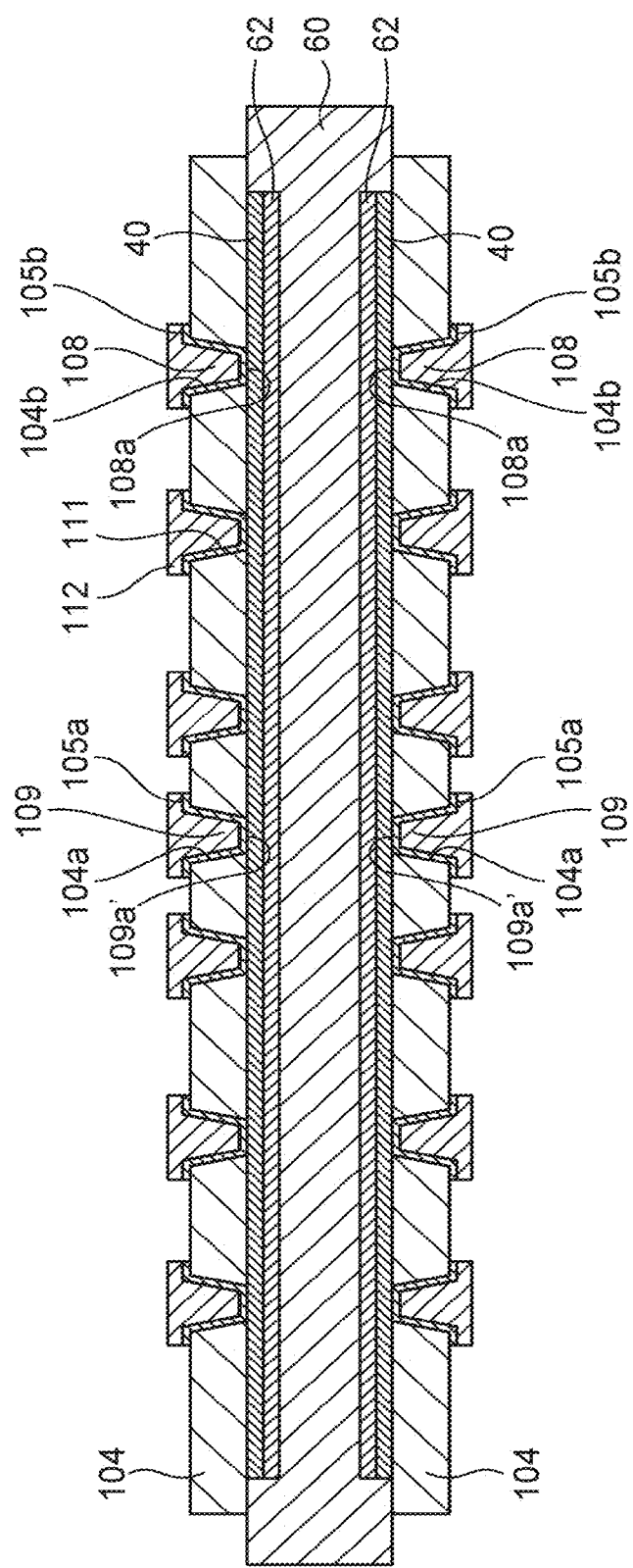
FIG. 4C is a process diagram describing the method for manufacturing the printed wiring board.
Figure 5B:
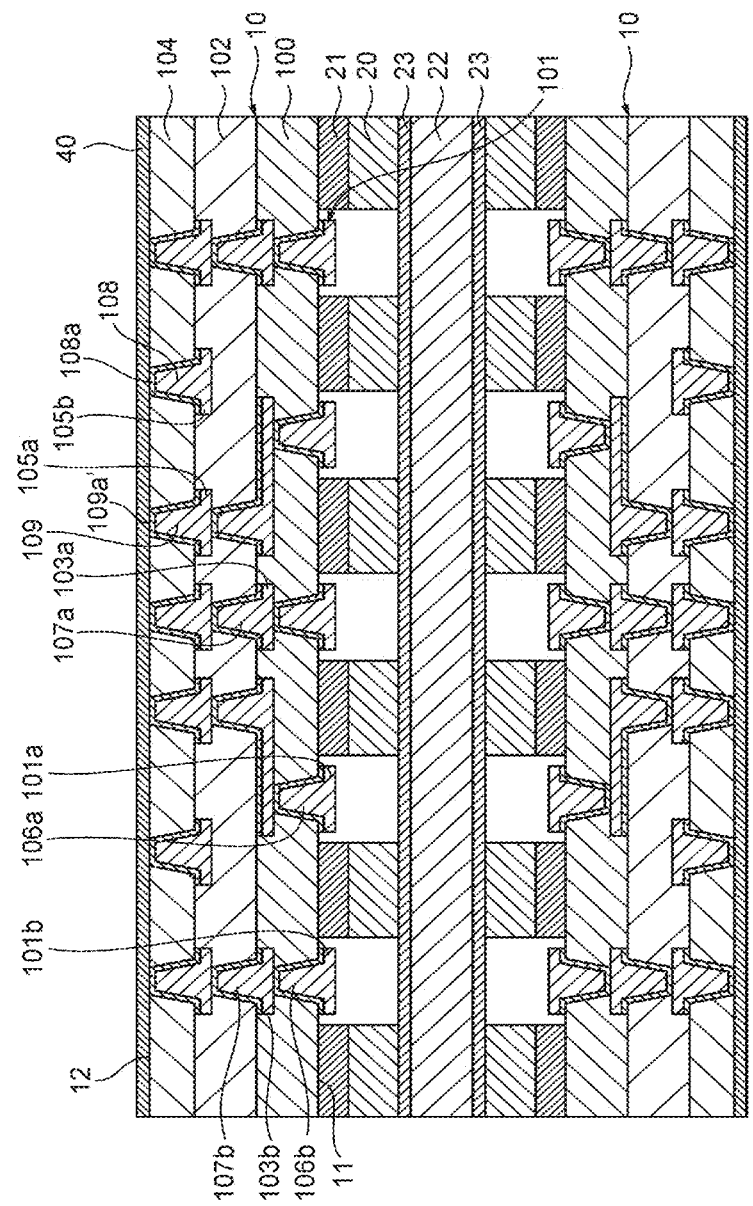
FIG. 5B is a process diagram describing the method for manufacturing the printed wiring board.

The second via conductors 109 are respectively formed inside the via holes (104a) and the first via conductors 108 are respectively formed inside the via holes (104b), and the wiring layers (105a, 105b) are formed on the insulating layer 104 (see FIG. 4C). Specifically, first, by applying a catalyst such as palladium to an upper surface of the insulating layer 104 and to inner wall surfaces and bottom surfaces of the via holes (104a, 104b) and immersing the surfaces in an electroless plating solution for 5-60 minutes, an electroless plating layer 111 having a thickness in a range of 0.1-5 μm is formed. Subsequently, a photosensitive resist layer is laminated on the electroless plating layer 111 and a resist pattern is formed by an exposure and development process.

By performing electrolytic plating using the electroless plating layer 111 as a power feeding layer, an electrolytic plating layer 112 is formed. Thereafter, the resist pattern is removed. Further, the electroless plating layer 111 that is exposed by the removal of the resist pattern is removed by an etching process. Then, the electroless plating layer 111 and the electrolytic plating layer 112 that remain on the upper surface of the insulating layer 104 form the wiring layers (105a, 105b).

On the hand, the electroless plating layer 111 and the electrolytic plating layer 112 filled in the via holes (104a) form the second via conductors 109, and the electroless plating layer 111 and the electrolytic plating layer 112 filled in the via holes (104b) form the first via conductors 108. In this case, the minimum-diameter-side surface (108a) of each of the formed first via conductors 108 and a minimum-diameter-side surface (109a)' of each of the second via conductors 109 are positioned on the copper foil 40. The minimum-diameter-side surface (109a)' of each of the second via conductors 109 is a precursor of the above-described minimum-diameter-side surface (109a), that is, is in a state before being etched by over-etching.

Next, by repeating the above-described method, the laminate 10 is formed. In this case, the lower surface of the insulating layer 104 forms the second main surface 12 of the laminate 10, and the upper surface of the insulating layer 100 forms the first main surface 11 of the laminate 10. Among the first main surface 11 and the second main surface 12, the second main surface 12 faces the copper foil 40 side (that is, is closest to the copper foil 40).

Third Process

Using the above-described method, the via conductors (106a, 106b) are formed in the insulating layer 100, and the wiring layer 101 that includes the multiple conductor pads (101a, 101b) is forming on the upper surface of the insulating layer 100 (that is, on the first main surface 11 of the laminate 10) (see FIG. 4D).

Fourth Process

By cutting an outer periphery of the laminate 10 formed on the first base plate 60 along arrows (F) in FIG. 4D, the first base plate 60 and the carrier copper foil 62 are peeled off. By peeling off the first base plate 60 and the carrier copper foil 62, the copper foil 40 is exposed.

Fifth Process

The second base plate 20, on which the adhesive layer 21 is formed, is prepared. For example, a material having a certain strength such as a metal plate or a prepreg material is used for the second base plate 20. Subsequently, the openings (20a, 20b) are formed in advance in the second base plate 20 and the adhesive layer 21 such that, in a state in which the second base plate 20 is affixed to the first main surface 11 of the laminate 10, the conductor pads (101a, 101b) that are formed on the first main surface 11 are exposed (see FIG. 5A). The second base plate 20 and the adhesive layer 21 illustrated in FIG. 5A appear to be segmentalized by the openings (20a, 20b), but are actually in a connected state. Further, opening sizes of the openings (20a, 20b) can be adjusted according to sizes of the conductor pads (101a, 101b).

Sixth Process

The second base plate 20 is affixed to the first main surface 11 of the laminate 10 via the adhesive layer 21. Then, in the state in which the second base plate 20 is affixed to the first main surface 11, the conductor pads (101a) are exposed from the openings (20a) that are formed in the second base plate 20 and the adhesive layer 21 and, on the other hand, the conductor pads (101b) are exposed from the openings (20b).

Subsequently, the third base plate 22, on both sides of which an adhesive layer 23 is formed, is prepared. Similar to the second base plate 20, a material having certain strength such as a metal plate or a prepreg material is used for the third base plate 22. Next, the second base plate 20 in the state of being affixed to the first main surface 11 of the laminate 10 is fixed to the third base plate 22 via the adhesive layer 23. In this case, the copper foil 40 is positioned on a side farthest from the third base plate 22 (see FIG. 5B).

Seventh Process

The minimum-diameter-side surfaces of the second via conductors 109 are exposed. Specifically, first, a photosensitive resist layer 32 is applied on the copper foil 40. Thereafter, by performing an exposure and development process, an opening (32a) for exposing the copper foil 40 positioned in the central portion of the second main surface 12 (that is, the copper foil 40 corresponding to the second via conductors 109) is formed. Next, the copper foil 40 exposed from the opening (32a) is removed by etching, and the minimum-diameter-side surfaces (109a) of the second via conductors 109 are exposed (see FIG. 5C).

Figure 5C:
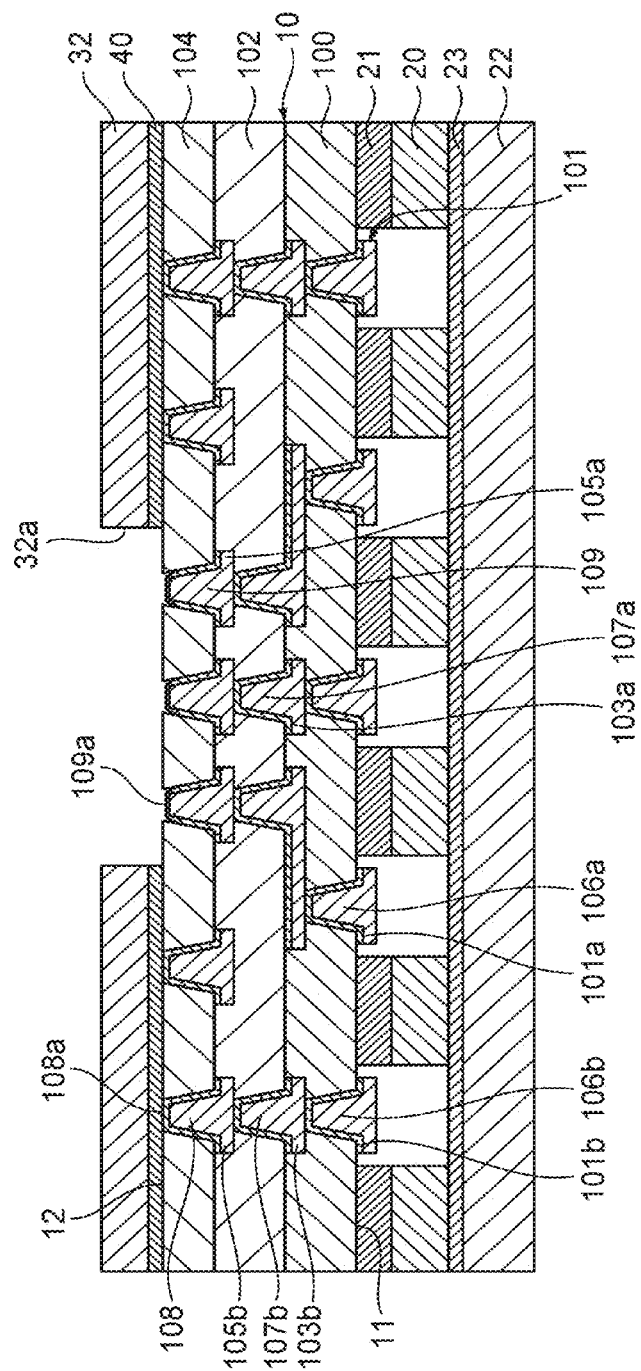
FIG. 5C is a process diagram describing the method for manufacturing the printed wiring board.
Figure 5D:
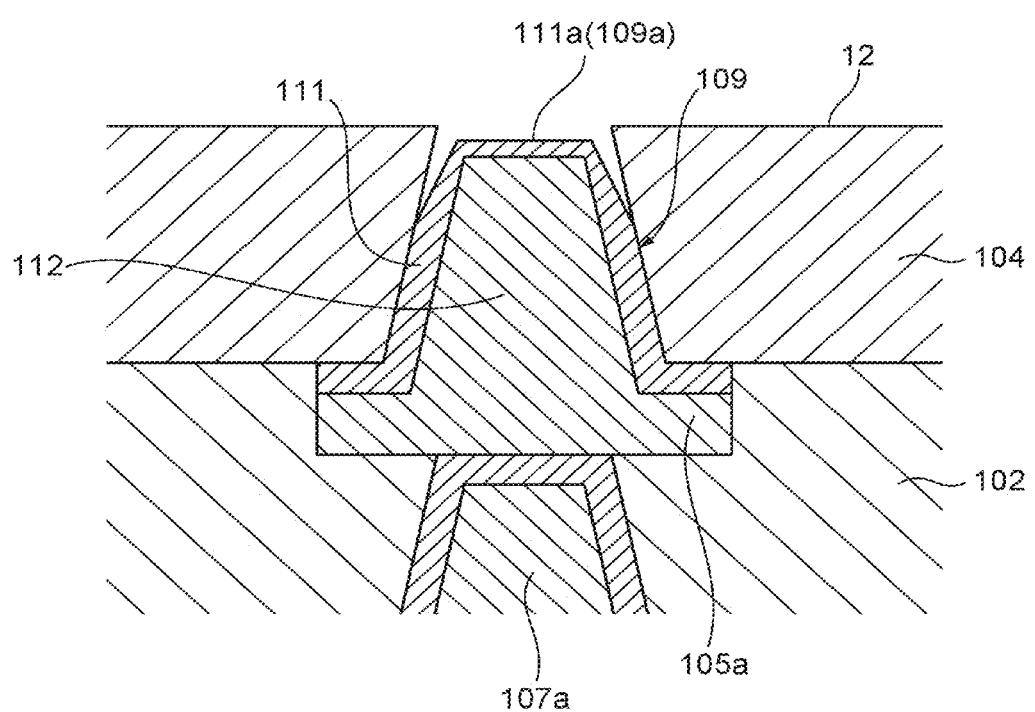
FIG. 5D is a partial enlarged view of a second via conductor illustrated in Fig. C.

FIG. 5D is a partial enlarged view of a second via conductor 109 illustrated in FIG. 5C. When the copper foil 40 exposed from the opening (32a) is etched, an etching solution is in contact with the electroless plating layer 111 by over etching, and an upper surface and an side surface of the electroless plating layer 111 are partially etched. As a result, an upper surface (111a) of the electroless plating layer 111 (that is, the minimum-diameter-side surface (109a) of each the second via conductors 109) is recessed from the second main surface 12. Further, a gap having a wedge-shape cross section is formed between the side surface of the electroless plating layer 111 and the insulating layer 104.

Figure 5E:
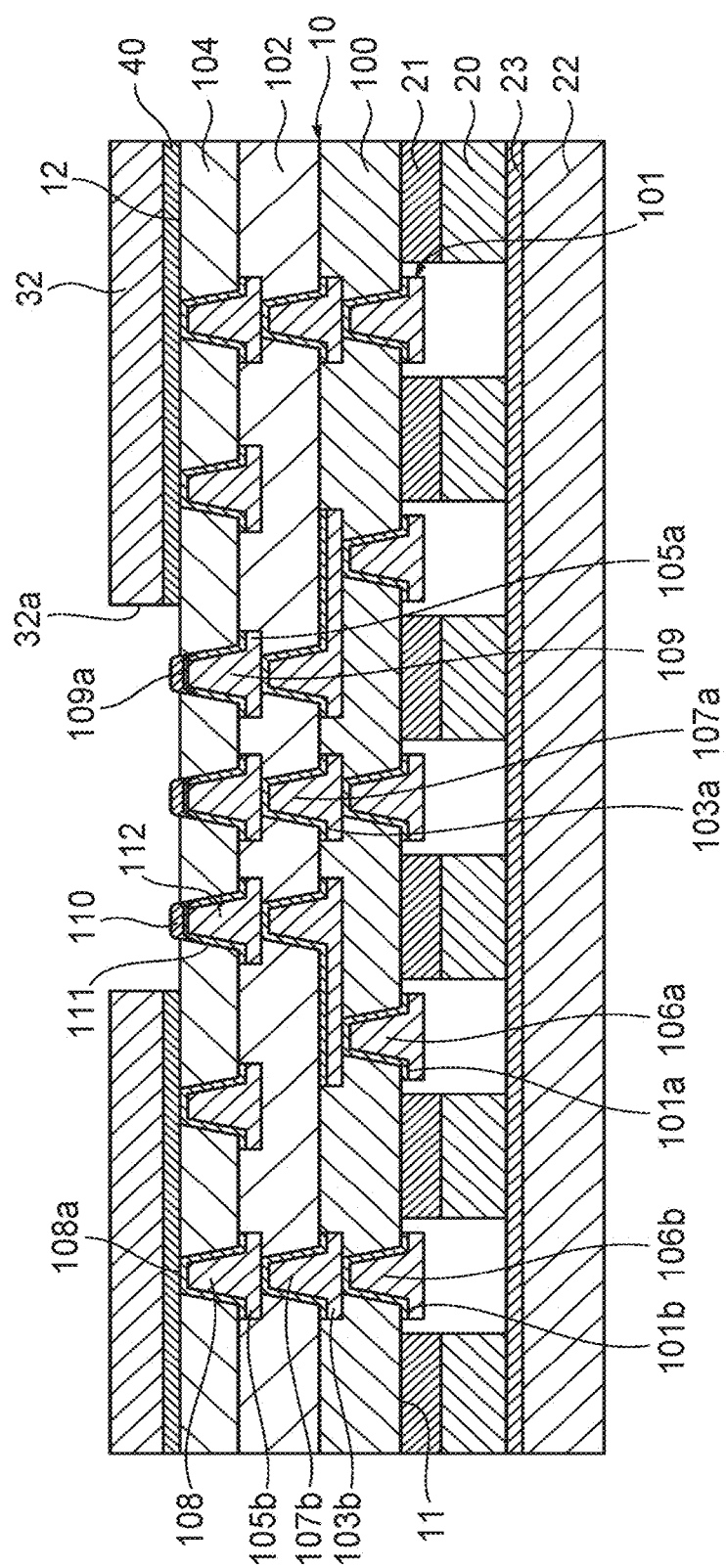
FIG. 5E is a process diagram describing the method for manufacturing the printed wiring board.

Subsequently, the surface treatment layer 110 is formed on the minimum-diameter-side surface (109a) of the second via conductors 109 (see FIG. 5E). As the surface treatment layer 110, for example, multiple metal films or a single metal film, such as Ni/Pd/Au, Ni/Au, or Sn, may be formed using a plating method. The surface treatment layer 110 is formed so as to wrap the electroless plating layer 111 from above and around the electroless plating layer 111. Further, a portion of the surface treatment layer 110 enters a gap between the electroless plating layer 111 and the insulating layer 104, and is in close contact with the electroless plating layer 111. In this case, in order to facilitate mounting an external electronic component via the surface treatment layer 110, it is preferable that the surface treatment layer 110 be formed such that the upper surface (110a) of the surface treatment layer 110 protrudes to the outside from the second main surface 12.

Eighth Process

The conductor posts 30 are formed on the copper foil 40 at positions in contact with the first via conductors 108. Specifically, first, a photosensitive resist layer 41 is applied on the copper foil 40, the second via conductors 109 and the second main surface 12. Thereafter, multiple openings (41a) are formed in the photosensitive resist layer 41 at positions in contact with the first via conductors 108 by an exposure and development process (see FIG. 6A). In this case, a diameter of each of the formed openings (41a) is larger than the diameter of each of the first via conductors 108. Subsequently, by performing electrolytic copper plating using the copper foil 40 as a power feeding layer, the plating layer 31 is formed in each of the openings (41a). The formed plating layer 31 and the copper foil 40 form a conductor post 30. Thereafter, by polishing a surface of the plating layer 31, a height of the conductor post 30 can be adjusted. In this way, by using the copper foil 40 as a power feeding layer, it is not necessary to newly provide a power feeding layer and thus the manufacturing process can be simplified.

Ninth Process

Figure 6C:
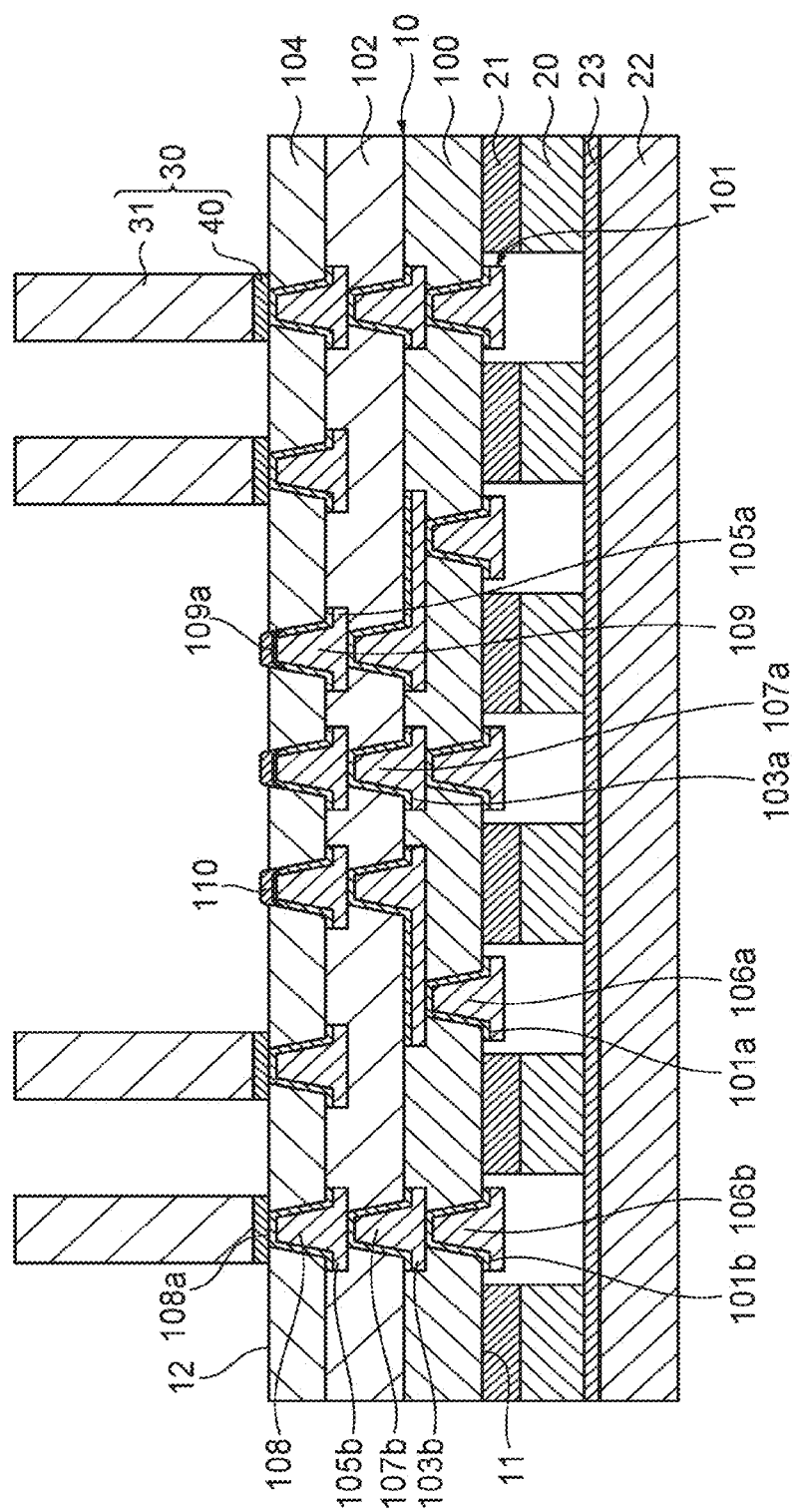
FIG. 6C is a process diagram describing a method for manufacturing the printed wiring board.
Figure 6D:
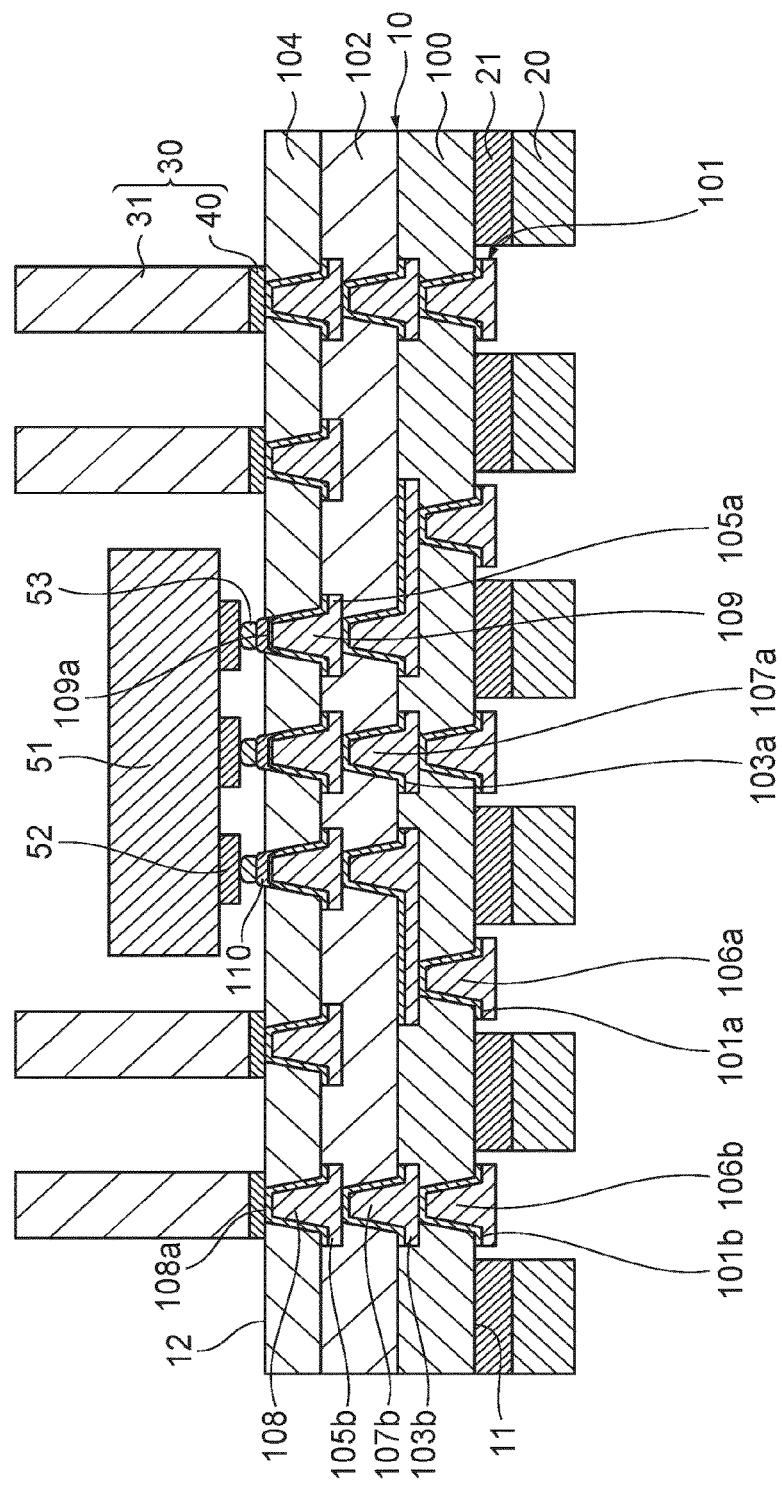
FIG. 6D is a schematic cross-sectional view for describing mounting an electronic component on the printed wiring board.
Figure 6E:
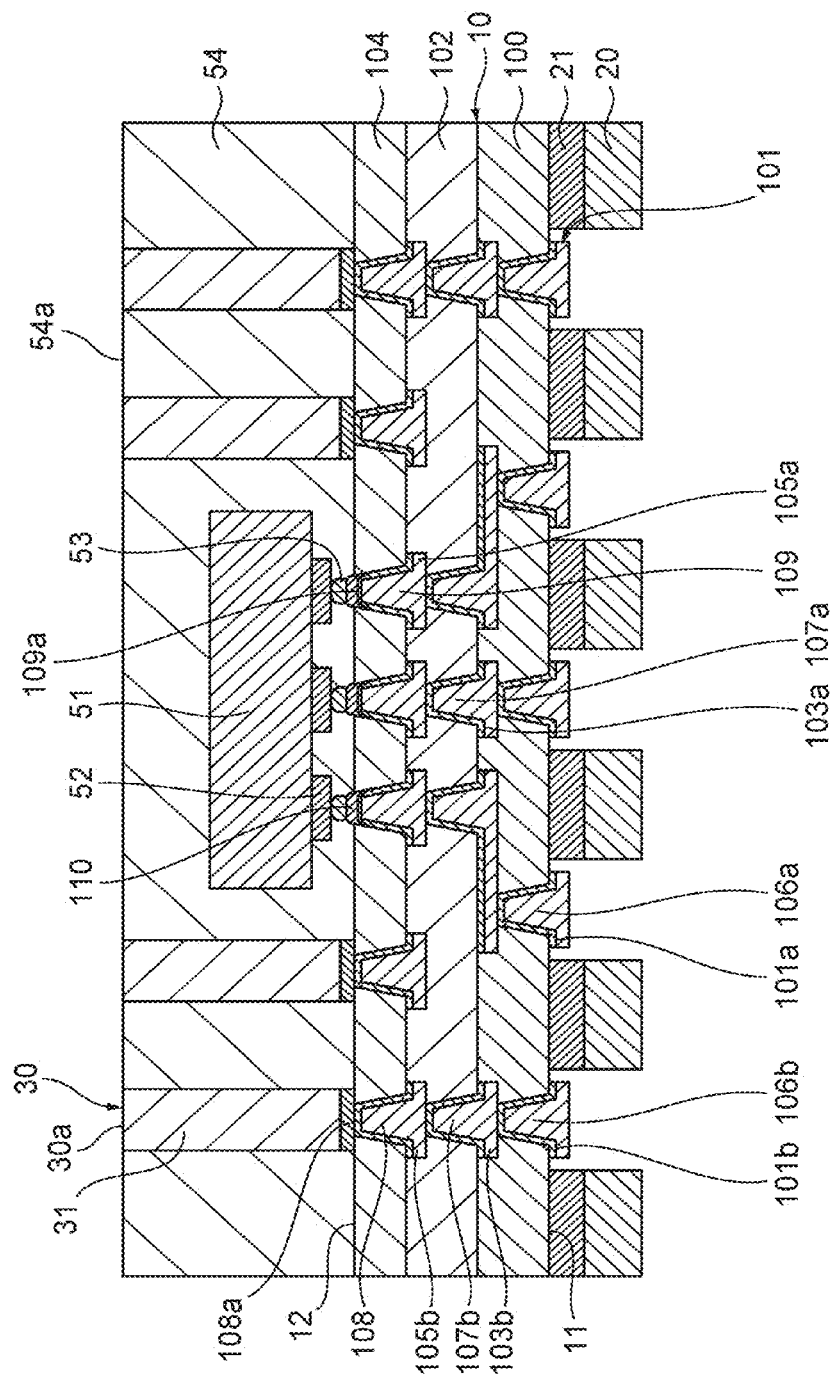
FIG. 6E is a schematic cross-sectional view for describing forming a sealing resin layer on the printed wiring board.

The remaining photosensitive resist layer 41 is removed, for example, using a solution containing monoethanolamine (see FIG. 6B). Thereafter, an exposed portion of the copper foil 40, other than a portion that is in contact with the conductor posts 30, is removed by selective etching (see FIG. 6C). Here, the portion that is in contact with the conductor posts 30 is a portion of the copper foil 40 that overlaps with the plating layer 31 in a plan view.

Next, by removing the adhesive layer 23, the third base plate 22 is removed. As a result, the printed wiring board 1 is manufactured. Subsequently, as described above, conti- nuity check between the conductor posts 30 and the conductor pads (101b) and continuity check between the surface treatment layers 110 and the conductor pads (101a) are respectively performed. Next, with respect to the printed wiring board 1 that has passed the continuity check, by mounting an electronic component 51 on the surface treatment layers 110 via solder bumps 53, terminals 52 of the electronic component 51 are electrically connected to the second via conductors 109 (see FIG. 6D). Subsequently, the mounted electronic component 51 and the conductor posts 30 are sealed using a sealing resin layer 54. Specifically, a mold resin is applied to the second main surface 12 of the laminate 10 and a sealing resin layer 54 is formed such that the electronic component 51, the solder bumps 53, the conductor posts 30 and the like are covered (see FIG. 6E).

When the sealing resin layer 54 is formed, it is possible that the sealing resin layer 54 is formed such that an upper surface (54a) of the sealing resin layer 54 is on the same plane as the top surfaces (30a) of the conductor posts 30. Or, it is also possible that the sealing resin layer 54 is formed such that the top surfaces (30a) of the conductor posts 30 are covered and thereafter, the sealing resin layer 54 and the conductor posts 30 are polished until the upper surface (54a) of the sealing resin layer 54 and the top surfaces (30a) of the conductor posts 30 are on the same plane.

Tenth Process

By removing the adhesive layer 21, the second base plate 20 is removed.

In the above-described manufacturing method, in accordance with the manufacturing stages, the first base plate 60, the second base plate 20 and the third base plate 22 that each have certain strength are used. Therefore, occurrence of warpage due to a difference between thermal expansion coefficients of materials or the like can be suppressed. Further, the openings (20a, 20b) for exposing the conductor pads (101a, 101b) are formed in the second base plate 20. Therefore, occurrence of warpage of the printed wiring board 1 can be prevented and influence on the continuity check due to the affixing of the second base plate 20 can be reduced. Further, the mounting of the electronic component 51 and the formation of the sealing resin layer 54 are performed in the state in which the base plate 20 is affixed to the first main surface 11 of the laminate 10. Therefore, occurrence of warpage can be suppressed and an effect of improving mountability can also be expected.

Second Embodiment

Figure 7:
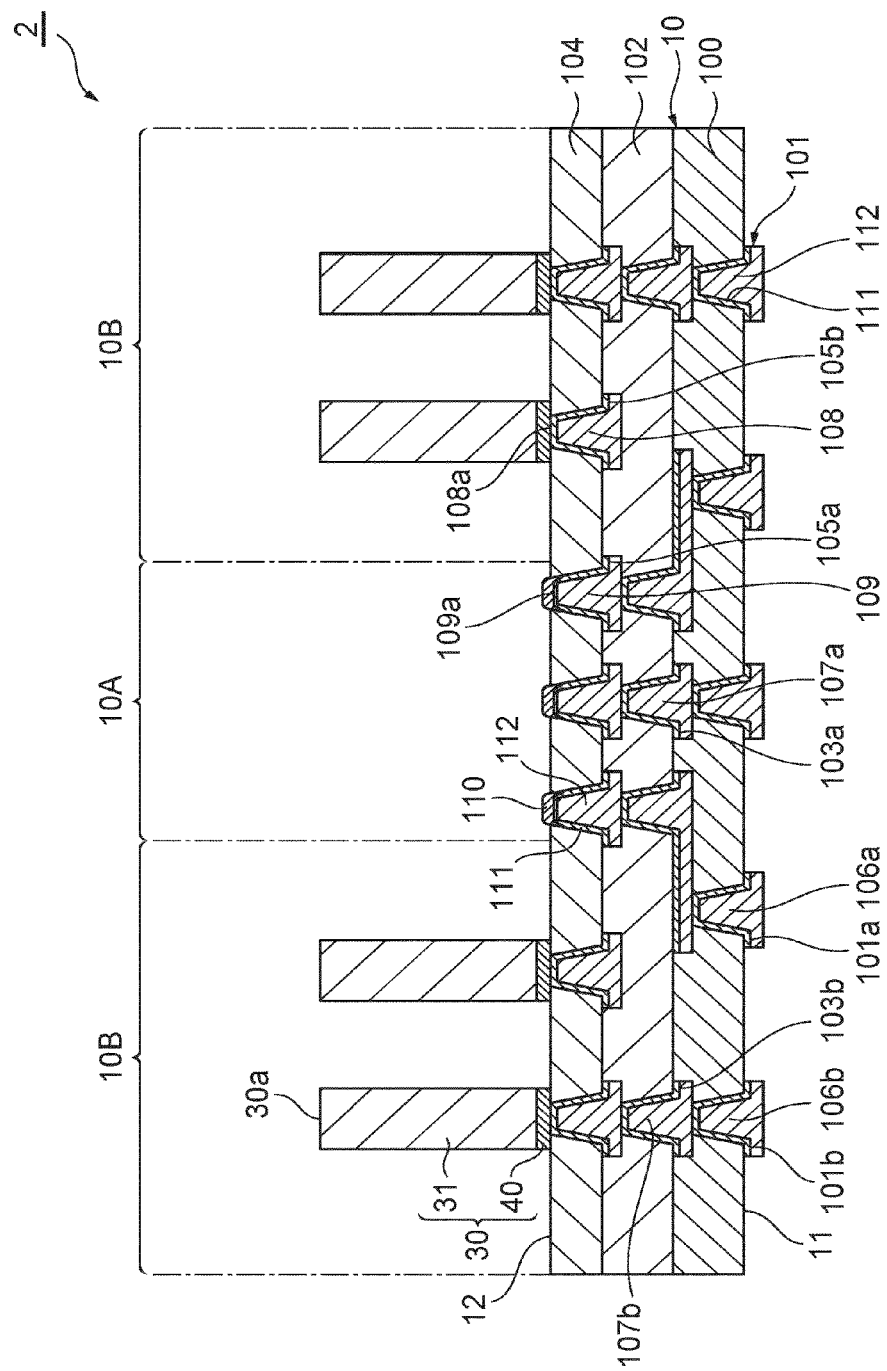
FIG. 7 is a schematic cross-sectional view illustrating a printed wiring board according to a second embodiment.

FIG. 7 is a schematic cross-sectional view illustrating a printed wiring board according to a second embodiment. A printed wiring board 2 according to the present embodiment is different from the first embodiment in that the base plate 20 is not provided. The printed wiring board 2 according to the present embodiment, for example, is manufactured by removing the adhesive layer 21 and the base plate 20 after the printed wiring board 1 is manufactured as illustrated in the above-described tenth process without performing the mounting of the electronic component 51 and the formation of the sealing resin layer 54. The so-structured printed wiring board 2 can achieve the same operation effect as the above-described first embodiment.

Third Embodiment

Figure 8:
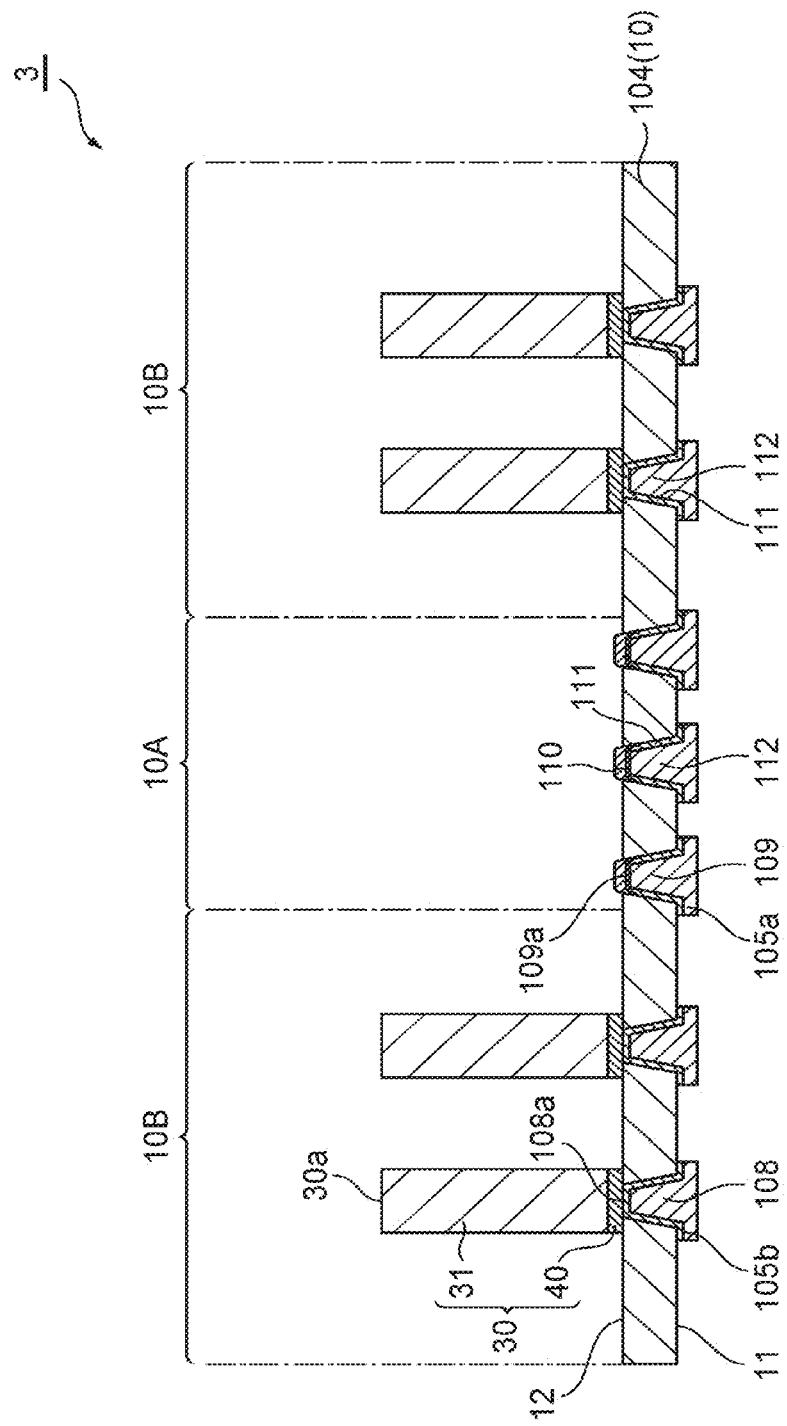
FIG. 8 is a schematic cross-sectional view illustrating a printed wiring board according to a third embodiment.

FIG. 8 is a schematic cross-sectional view illustrating a printed wiring board according to a third embodiment. A printed wiring board 3 according to the present embodiment is different from the second embodiment in that the laminate 10 includes only one insulating layer, which is the insulating layer 104. In this case, a lower surface of the insulating layer 104 forms the first main surface 11 of the laminate 10, and the upper surface of the insulating layer 104 forms the second main surface 12 of the laminate 10. The wiring layers (105a, 105b) correspond to "first conductor pads" in the claims. The so-structured printed wiring board 3 can achieve the same operation effect as the above-described first embodiment.

In the following, with reference to FIGS. 9 and 10, a semiconductor package of a POP structure, in which the printed wiring board 2 of the second embodiment is used, is described.

Figure 9:
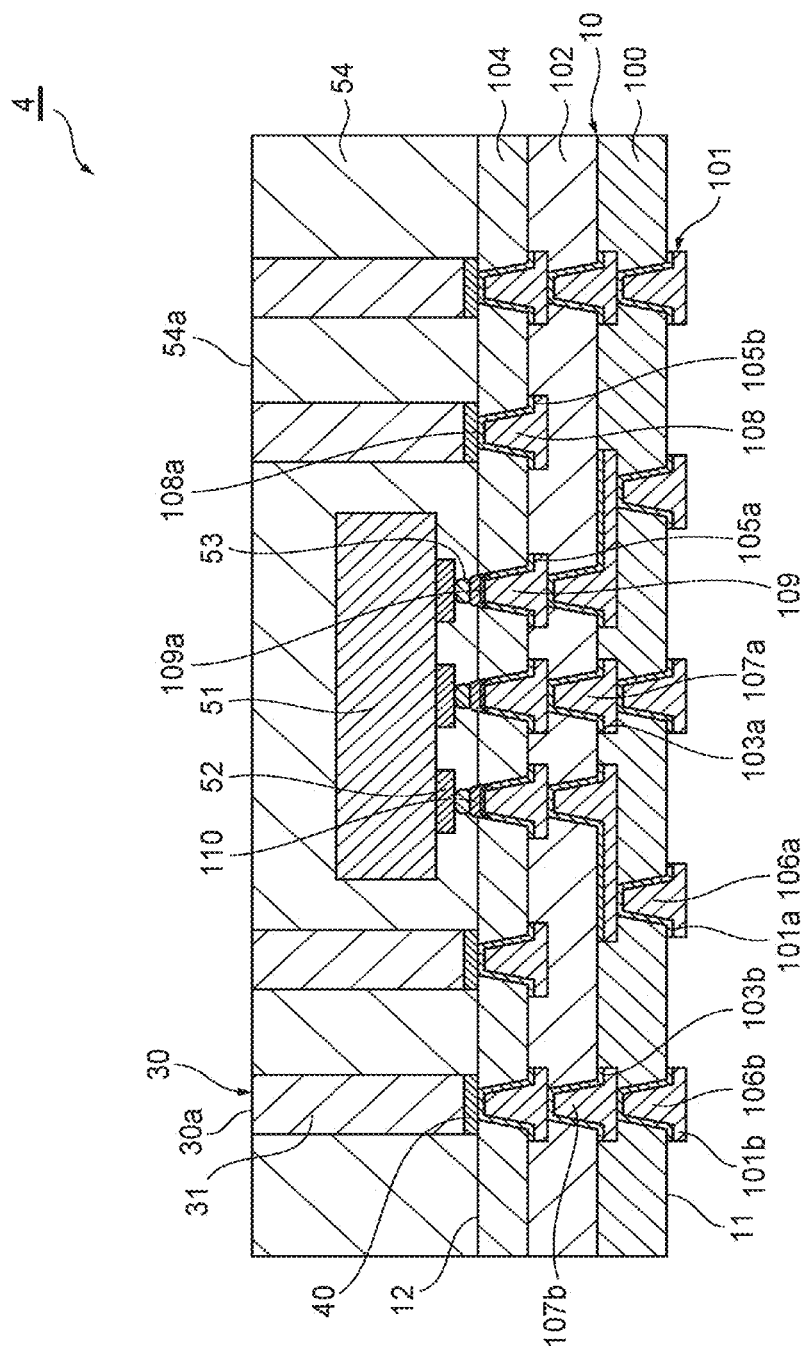
FIG. 9 is a schematic cross-sectional view illustrating a semiconductor package of a POP structure that uses the printed wiring board.

In the example illustrated in FIG. 9, the electronic component 51 is mounted on the second main surface 12 side of the laminate 10. The terminals 52 of the electronic component 51 are electrically connected to the surface treatment layers 110 via the solder bumps 53. Further, the sealing resin layer 54 is provided on the second main surface 12 of the laminate 10. The electronic component 51 and the solder bumps 53 are sealed by the sealing resin layer 54. On the other hand, the conductor posts 30, except the top surfaces (30a), are sealed by the sealing resin layer 54. The top surfaces (30a) are positioned on the plane as the upper surface (54a) of the sealing resin layer 54, and are exposed to the outside.

In the so-structured semiconductor package 4, the conductor posts 30, the electronic component 51 and the like are protected by the sealing resin layer 54 and thus are protected from vibration, impact and the like. Further, the top surfaces (30a) of the conductor posts 30 are positioned on the same plane as the upper surface (54a) of the sealing resin layer 54 and are exposed to the outside. Therefore, the conductor posts 30 can be easily connected to another wiring board. The semiconductor package 4, for example, is manufactured by using the above-described method illustrated in FIGS. 6D and 6E and then by removing the second base plate 20.

Figure 10:
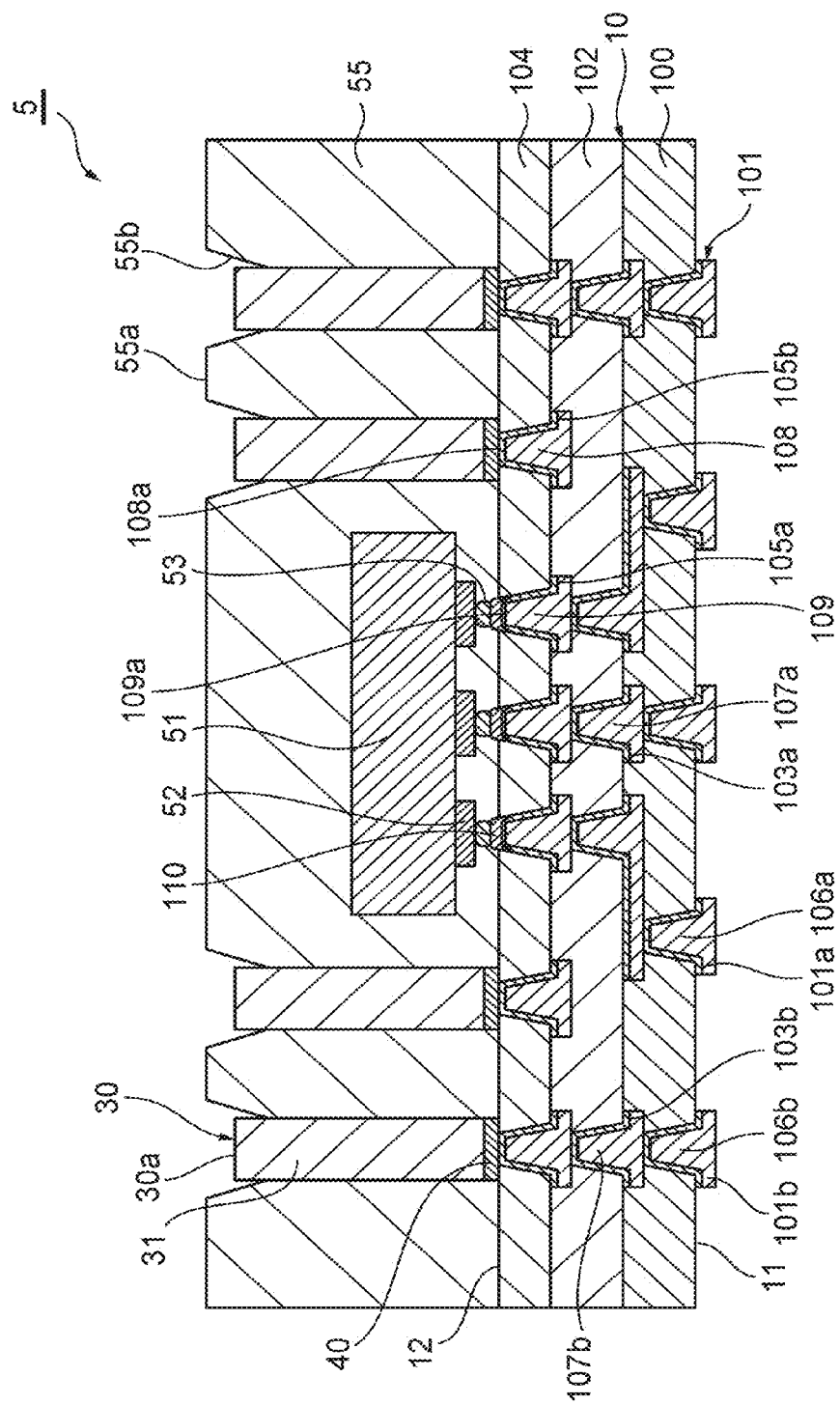
FIG. 10 is a schematic cross-sectional view illustrating a semiconductor package of a POP structure that uses the printed wiring board.

In the example illustrated in FIG. 10, the electronic component 51 is mounted on the second main surface 12 of the laminate 10. The electronic component 51, the solder bumps 53 and the conductor posts 30 are sealed by a sealing resin layer 55. Openings (55b) that each expose a top surface (30a) and a portion of a side surface of a conductor post 30 are formed in the sealing resin layer 55.

In the so-structured semiconductor package 5, the conductor posts 30 and the electronic component 51 that is mounted on the second via conductors 109 are sealed by the sealing resin layer 55. Therefore, the conductor posts 30 and the electronic component 51 are protected by the sealing resin layer 55 and thus are protected from an external impact or the like. Further, the top surfaces (30a) of the conductor posts 30 are also exposed to the outside. Therefore, while being protected by the sealing resin layer 55, the conductor posts 30 can be easily connected to another wiring board.

The semiconductor package 5, for example, is manufactured using the following method. That is, first, the electronic component 51 is mounted to the surface treatment layers 110 via the solder bumps 53. Next, after the electronic component 51, the conductor posts 30 and the like are sealed by the sealing resin layer 55, the openings (55b) are formed by laser processing such that a front end and a portion of a side surface of each of the conductor posts 30 are exposed to the outside. Finally, the second base plate 20 is removed.

In the above, embodiments of the present invention are described in detail. However, the present invention is not limited to the above-described embodiments. Various modifications are possible within the scope without departing from the spirit of the present invention as set forth in the appended claims. For example, in the above-described method for manufacturing the printed wiring board 1, the case is described where the openings (20a, 20b) that expose the conductor pads (101a, 101b) are formed in advance in the adhesive layer 21 and the second base plate 20 and thereafter the second base plate 20 is affixed to the laminate 10. However, it is also possible that the laminate 10 is affixed to the second base plate without foil ling the openings, and the openings are formed before the continuity check. Further, when necessary, it is also possible that a solder resist layer is formed on the second main surface 12 of the laminate 10. Further, in the above-described embodiments, the example is described in which the surface treatment layer 110 is formed on the minimum-diameter-side surface (109a) of each of the second via conductors 109. However, it is also possible that the surface treatment layer 110 is not formed.

In the method of U.S. Patent Application Publication No. 2010/0289134 A1, when heated in a reflow oven or the like, the solder balls are likely to melt and flow to surrounding areas. Further, since a load of the mounted upper substrate acts on the solder balls, the solder balls are likely to laterally expand. Therefore, an electrical short circuit is likely to occur between adjacent solder balls. In order to prevent occurrence of such an electrical short circuit, it has been considered to increase, to some extent, distances between mounting pads on which the solder balls are placed. However, when the distances between the mounting pads are increased, there is a new problem that it is difficult to form wirings at a fine pitch.

A printed wiring board according to an embodiment of the present invention includes: a laminate that has a first main surface and a second main surface that is on an opposite side of the first main surface; a wiring layer that is formed on the first main surface of the laminate and includes multiple conductor pads; and multiple via conductors that are formed in the laminate and are each gradually reduced in diameter from the first main surface toward the second main surface. The multiple via conductors include multiple first via conductors and multiple second via conductors, the first via conductors being formed in an outer edge portion of the laminate and a minimum-diameter-side surface of each of the first via conductors being positioned on the same plane as the second main surface, and the second via conductors being formed in a central portion of the laminate and a minimum-diameter-side surface of each of the second via conductors being recessed from the second main surface. A conductor post that includes a metal foil and a plating layer that is formed on the metal foil is formed on each of the first via conductors.

Further, a method for manufacturing a printed wiring board according to an embodiment of the present invention includes: a first process in which a metal foil with a carrier copper foil is affixed to a first base plate; a second process in which multiple first via conductors expanded in diameter are formed in an outer edge portion of a metal foil and multiple second via conductors expanded in diameter are formed in a central portion of the metal foil such that a minimum-diameter-side surface of each of the via conductors is positioned on the metal foil, and a laminate having a first main surface and a second main surface that is on an opposite side of the first main surface is formed on the metal foil such that the second main surface faces the metal foil side; a third process in which a wiring layer that includes multiple conductor pads is formed on the first main surface of the laminate; a fourth process in which the metal foil is exposed by peeling off the first base plate and the carrier copper foil; a fifth process in which a second base plate on which an adhesive layer is formed is prepared, and openings are formed in advance in the second base plate and the adhesive layer such that, in a state in which the second base plate is affixed to the first main surface of the laminate, the conductor pads that are formed on the first main surface are exposed; a sixth process in which the second base plate is affixed to the first main surface of the laminate via the adhesive layer; a seventh process in which the minimum-diameter-side surfaces of the second via conductors are exposed by removing the central portion of the metal foil; an eighth process in which conductor posts are formed on the metal foil at positions in contact with the first via conductors by performing plating processing; and a ninth process in which the metal foil except portions in contact with the conductor posts is removed.

According to an embodiment of the present invention, formation of wirings at a fine pitch can be achieved while occurrence of an electrical short circuit can be prevented, and occurrence of wargape can be suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a laminate;
   a wiring layer formed on a first main surface of the laminate and comprising a plurality of conductor pads;
   a plurality of via conductors including a plurality of first via conductors and a plurality of second via conductors and formed in the laminate such that each of the via conductors has a diameter gradually reducing from the first main surface toward a second main surface of the laminate on an opposite side with respect to the first main surface; and
   a plurality of conductor post formed on the plurality of first via conductors respectively such that each of the conductor posts comprises a metal foil and a plating layer formed on the metal foil,
   wherein the plurality of via conductors is formed such that the first via conductors are positioned in an outer edge portion of the laminate and have minimum-diameter-side surfaces positioned to form a same plane with respect to the second main surface of the laminate and that the second via conductors are positioned in a central portion of the laminate and have minimum-diameter-side surfaces recessed from the second main surface of the laminate.

2. A printed wiring board according to claim 1, further comprising:
   a surface treatment layer formed on each of the second via conductors such that the surface treatment layer is formed on the minimum-diameter-side surface of each of the second via conductors.

3. A printed wiring board according to claim 2, wherein the surface treatment layer is formed on each of the second via conductors such that the surface treatment layer has an upper surface projecting outside the second main surface of the laminate.

4. A printed wiring board according to claim 1, further comprising:
   a base plate fixed to the first main surface of the laminate via an adhesive layer.

5. A printed wiring board according to claim 4, wherein the base plate and the adhesive layer have a plurality of openings exposing the plurality of conductor pads, respectively.

6. A printed wiring board according to claim 5, wherein the plurality of conductor pads includes a plurality of conductor pads coaxially aligned with the plurality of first via conductors and the plurality of conductor posts.

7. A printed wiring board according to claim 1, wherein the plurality of via conductors is formed such that the plurality of first via conductors has a pitch which is greater than a pitch of the plurality of second via conductors.

8. A printed wiring board according to claim 1, wherein the plurality of conductor posts is formed such that the plurality of conductor posts satisfies 50 μm<h<200 μm where h represents a height of the conductor posts.

9. A printed wiring board according to claim 2, further comprising:
   a base plate fixed to the first main surface of the laminate via an adhesive layer.

10. A printed wiring board according to claim 9, wherein the base plate and the adhesive layer have a plurality of openings exposing the plurality of conductor pads, respectively.

11. A printed wiring board according to claim 10, wherein the plurality of conductor pads includes a plurality of conductor pads coaxially aligned with the plurality of first via conductors and the plurality of conductor posts.

12. A printed wiring board according to claim 2, wherein the plurality of via conductors is formed such that the plurality of first via conductors has a pitch which is greater than a pitch of the plurality of second via conductors.

13. A printed wiring board according to claim 2, wherein the plurality of conductor posts is formed such that the plurality of conductor posts satisfies 50 μm<h<200 μm where h represents a height of the conductor posts.

14. A printed wiring board according to claim 3, further comprising:
   a base plate fixed to the first main surface of the laminate via an adhesive layer.

15. A printed wiring board according to claim 14, wherein the base plate and the adhesive layer have a plurality of openings exposing the plurality of conductor pads, respectively.

16. A printed wiring board according to claim 15, wherein the plurality of conductor pads includes a plurality of conductor pads coaxially aligned with the plurality of first via conductors and the plurality of conductor posts.

* * * * *